United States Patent [19]
Brandt

[11] Patent Number: 6,104,332
[45] Date of Patent: Aug. 15, 2000

[54] ABSOLUTE VALUE CIRCUIT AND METHOD

[75] Inventor: Brian Paul Brandt, Windham, N.H.

[73] Assignee: National Semiconductor Corporation, Santa Clara, Calif.

[21] Appl. No.: 09/389,800

[22] Filed: Sep. 3, 1999

Related U.S. Application Data

[63] Continuation of application No. 09/164,219, Sep. 30, 1998.

[51] Int. Cl.$^7$ .............................. H03M 1/12; H03M 3/00
[52] U.S. Cl. ............................................ 341/156; 341/143
[58] Field of Search .................................. 341/156, 143, 341/120; 364/715.012, 702

[56] References Cited

U.S. PATENT DOCUMENTS

| | | | |
|---|---|---|---|
| 4,733,217 | 3/1988 | Dingwall | 340/347 AD |
| 4,894,565 | 1/1990 | Hwang et al. | 341/120 |
| 4,903,023 | 2/1990 | Evans et al. | 341/120 |
| 4,947,168 | 8/1990 | Myers | 341/120 |
| 5,047,772 | 9/1991 | Ribner | 341/156 |
| 5,134,399 | 7/1992 | Hiller | 341/131 |
| 5,223,836 | 6/1993 | Komatsu | 341/156 |
| 5,552,784 | 9/1996 | Evans | 341/122 |

OTHER PUBLICATIONS

Hayatleh et al, "Current–Mode Absolute Value Circuits for Wideband Performance," IEE, pp. 1–5, 1996.
A 10–b 20–MHz 30–mW Pipelined Interpolating CMOS ADC, Keiichi Kusumoto, Akira Matsuzawa, Member, IEEE, and Kenji Murata, IEEE Journal of Solid–State Circuits, vol. 28, No. 12, Dec., 1993, pp. 1200–1206.

Primary Examiner—Michael Tokar
Assistant Examiner—Patrick Wamsley
Attorney, Agent, or Firm—Limbach & Limbach, L.L.P.

[57] ABSTRACT

An analog-to-digital converting including a resistor network for producing a group of coarse differential reference voltages and a group of fine differential reference voltages, a bank of coarse comparators receiving the coarse differential reference voltage and a bipolar differential input voltage. A bank of fine comparators receives selected ones of the group of fine differential reference voltages, based upon the output of the coarse comparators during a previous clock interval, and a unipolar differential input voltage derived from the bipolar input. Encoder circuitry converts the output of the coarse and fine comparator banks to a digital output.

21 Claims, 12 Drawing Sheets

| ERROR COMPARATOR OUTPUTS | X | +4 | +3 | +2 | +1 | NO ERROR | −1 | −2 | −3 | −4 | X |
|---|---|---|---|---|---|---|---|---|---|---|---|
| | | | | | | LSB CORRECTION | | | | | |
| E5 P | 1 | 0 | 0 | 0 | 0 | 0 | 0 | 0 | 0 | 0 | 0 |
| E4 P | 1 | 1 | 0 | 0 | 0 | 0 | 0 | 0 | 0 | 0 | 0 |
| E3 P | 1 | 1 | 1 | 0 | 0 | 0 | 0 | 0 | 0 | 0 | 0 |
| E2 P | 1 | 1 | 1 | 1 | 0 | 0 | 0 | 0 | 0 | 0 | 0 |
| E1 P | 1 | 1 | 1 | 1 | 1 | 0 | 0 | 0 | 0 | 0 | 0 |
| E1 N | 1 | 1 | 1 | 1 | 1 | 1 | 0 | 0 | 0 | 0 | |
| E2 N | 1 | 1 | 1 | 1 | 1 | 1 | 1 | 0 | 0 | 0 | 0 |
| E3 N | 1 | 1 | 1 | 1 | 1 | 1 | 1 | 1 | 0 | 0 | 0 |
| E4 N | 1 | 1 | 1 | 1 | 1 | 1 | 1 | 1 | 1 | 0 | 0 |
| E5 N | 1 | 1 | 1 | 1 | 1 | 1 | 1 | 1 | 1 | 1 | 0 |

FIG. 14

ABSOLUTE VALUE CIRCUIT AND METHOD

This is a continuation of application No. 09/164,219, filed Sep. 30, 1998.

1. BACKGROUND OF THE INVENTION

The subject invention relates generally to data conversion circuitry and in particular, to an circuitry for improving the performance of analog-to-digital converters and similar analog signal processing circuitry.

2. DESCRIPTION OF RELATED ART

Low cost, relatively high speed, analog-to-digital converters (ADCs) have become critical building blocks for digital signal processing and video applications. By way of example, flash ADCs implemented in CMOS have been developed that are straightforward in design and are capable of high speed operation. However, an n bit flash ADC require $2^n$ separate comparators for each output. Thus, an eight bit flash ADC will require 256 comparator circuits, thereby requiring a large die size, increased power consumption and large input loading.

Subranging ADCs have been developed to address some of the shortcomings of the flash ADC. The subranging ADC incorporates a resistor network for generating multiple coarse reference voltages used to determine the MSB outputs and multiple fine reference voltages used to determine the LSB outputs. The resistor network is typically connected between a pair of reference voltages such as a positive voltage and ground. By way of example, for an eight bit ADC, the coarse resistor network will have a total of 15 relatively low value resistance sections thereby providing 16 different taps where 16 different magnitude reference voltages are produced. The fine resistor network includes a relatively high impedance section connected in parallel across each of the relatively low impedance sections of the coarse resistor network. Each fine resistor section provides 15 taps so that 15 different magnitude reference voltages a produced having magnitudes that are intermediate the reference voltage drop across the associated coarse resistance section.

Each of the 16 resistance taps of the coarse resistance network has an associated CMOS comparator circuit which compares the magnitude of the reference voltage produced at the tap with the analog voltage to be measured. Thus, there are 16 comparator circuits (coarse comparators) associated with the coarse resistor network which produce 16 outputs received by an MSB encoder circuit. The MSB encoder circuit provides the four MSB outputs of the ADC.

There are 15 additional comparator circuits (fine comparators) which are connected by way of an analog multiplexer to the 15 taps of each of the fine resistor sections. The multiplexer selects one of the groups of 15 taps for connection to the fine comparators based upon the MSB determination in the previous clock cycle. Thus, at least two clock intervals (half clock cycles), and frequently more, are necessary for each measurement as compared to flash ADCs which require significantly fewer intervals. The outputs of the fine comparators are received by a second encoder circuit which produces the four LSBs of the ADC.

Although the subranging ADC is slower than the flash ADC, the number of comparators needed in the subranging ADC is reduced from 256 to 31. Thus, less die area is needed, lower power consumption is achieved and less loading is placed on the analog input.

Although the conventional subranging ADCs provide several advantages over other types of ADCs, areas of needed improvement remain, with respect to such ADCs and similar analog processing circuitry. As will become apparent to those skilled in the art upon a reading of the following Detailed Description of the Invention together with the drawings, the present invention possesses several advantages over prior art analog processing circuitry.

BRIEF DESCRIPTION OF THE DRAWINGS

FIG. 14 is a chart showing the manner in which errors made by the coarse comparator bank are corrected.

SUMMARY OF THE INVENTION

An absolute value circuit for use in an analog measurement apparatus, such as an ADC, is disclosed. The circuit includes a polarity detector configured to provide a polarity signal indicative of the polarity of a bipolar differential analog input signal to be processed. The bipolar differential analog input signal includes first and second analog components.

The absolute value circuit further includes an absolute value converter having first and second inputs which receive the first and second analog components, respectively, of the differential analog input signal and first and second outputs, with the absolute value converter operating to couple the first input to the first output and the second input to the second output when the polarity signal is in a first state and operating to couple the first input to the second output and the second input to the first output when the polarity signal is in a second state, different than the first state.

Analog processing circuitry is further included which is configured to process the unipolar differential analog signal, with the analog processing circuity coupled to the first and second outputs of the absolute value circuit converter. In one embodiment, the analog processing circuitry includes a bank of differential comparators which compare the unipolar differential analog signal with a plurality of unipolar differential reference voltages. The outputs of the comparator bank are combined with a digital representation of the polarity signal to provide a digital output indicative of the magnitude and polarity of the bipolar differential analog input voltage. Among other things, the operating speed of the comparator bank is improved since the bank need only process unipolar differential analog inputs.

DETAILED DESCRIPTION OF THE INVENTION

Figure 1:
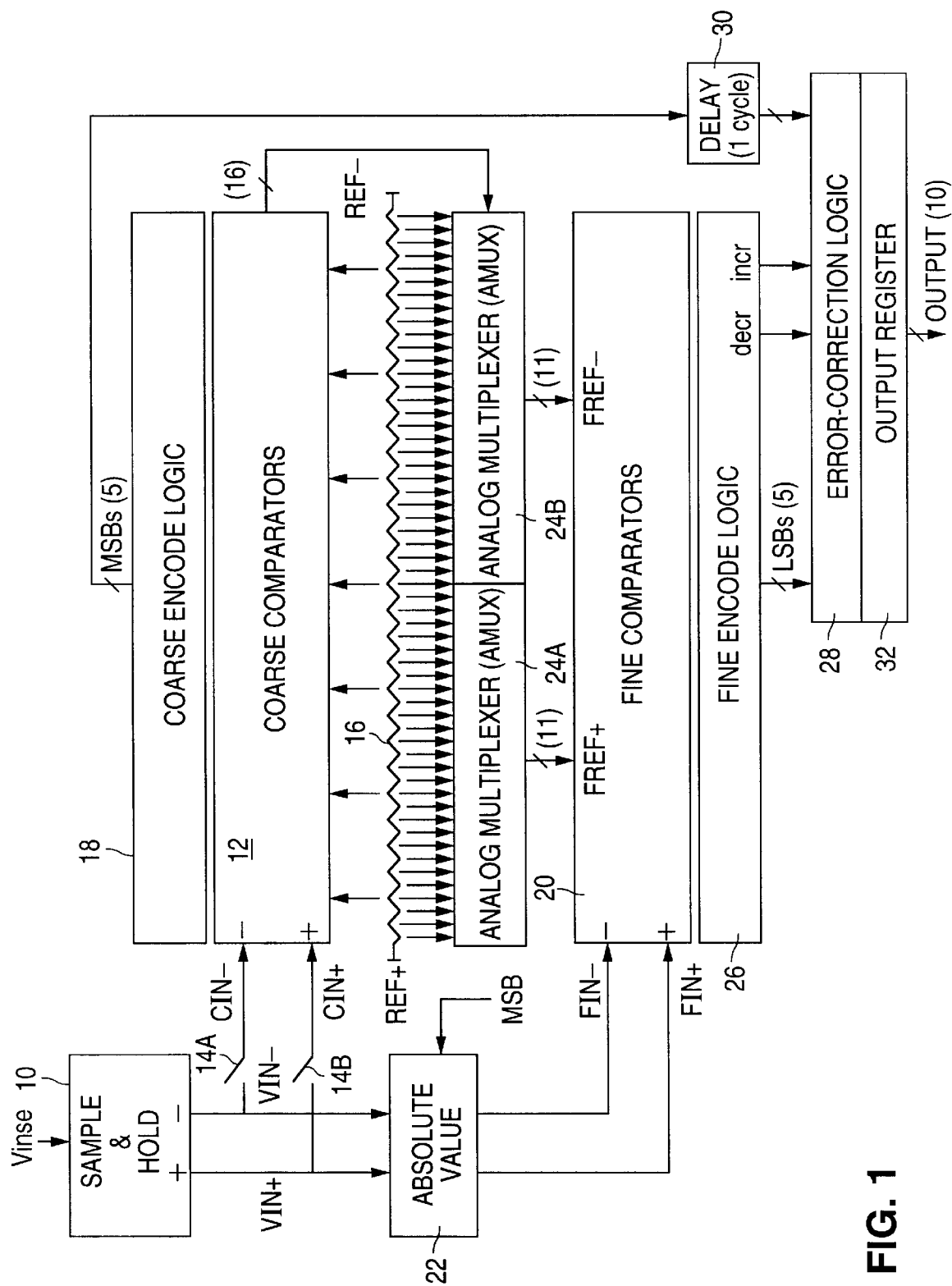
FIG. 1 is a block diagram showing the architecture of the ADC of the type suitable for utilizing the analog processing circuitry of the present invention.
Figure 2:
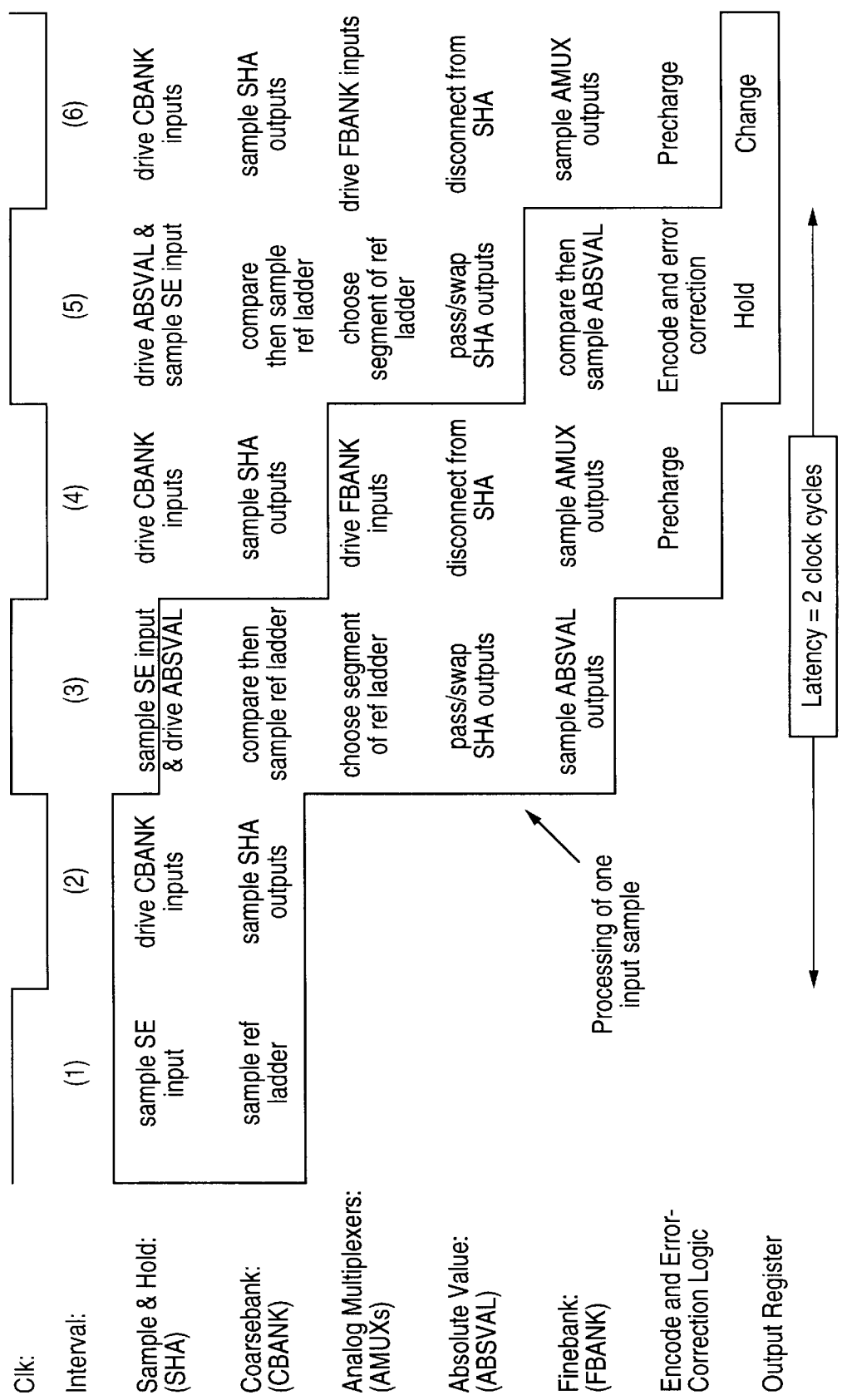
FIG. 2 is a timing diagram illustrating the operation of the ADC of FIG. 1.

Referring to the drawings, FIG. 1 is a block diagram the architecture of the a subranging ADC of the type suitable for utilizing the subject invention. The exemplary embodiment produces a ten bit digital output. FIG. 2 is a timing diagram illustrating the operation of the subject ADC over several clock intervals. The input to the ADC to be digitized is an analog signal Vinse. Vinse is a single-ended input which typically varies from +1.5 to +3.5 volts when using a single-ended supply voltage at +5 volts. Vinse is received by a sample and hold amplifier circuit 10 which converts the single-ended input having a 2 volt range to a differential output VIN+ and VIN− having a four volt range (−2 volts to +2 volts). As will be explained in greater detail, sample and hold circuit 10 is designed to hold the outputs VIN+ and VIN− for two consecutive clock intervals.

Differential signal VIN+ and VIN− is connected to the differential inputs of a bank of coarse differential comparators 12 by way of a pair of switches 14A and 14B, with the switched differential output being CIN+ and CIN−. There are a total of thirty-one coarse comparators in the coarse comparator bank 12 thereby defining thirty-two different output ranges. A resistor network 16 connected between a positive reference voltage REF+ and a negative reference voltage REF− produces a set of coarse differential reference voltages that are used by the coarse comparator bank 12. The thirty-one outputs of the coarse comparator bank 12 are encoded by coarse encode logic circuitry 18 which produces the five MSBs of the subject ADC.

The differential output VIN+ and VIN− of sample and hold amplifier circuit 10 is also coupled to a fine comparator bank 20 by way of an absolute value circuit 22. The absolute value circuit 22, in accordance with the present invention provides a single polarity differential output FIN+ and FIN−. When the polarity of the input VIN+ and VIN− is positive, as indicated by the MSB produced by the coarse encode logic circuitry 18, signal VIN− is simply passed through the absolute value circuit 22 as FIN− and signal VIN+ is passed through as FIN+. When the MSB indicates that the input polarity is negative, circuit 22 will reverse the polarity of the connections so that VIN+ is passed as FIN− and VIN− is passed as FIN+.

The fine comparator bank 20 includes a total of 41 comparators, 10 of which are for error correction, as will be explained. The comparators of the fine comparator bank 20 receive a set of fine differential reference voltages produced by the resistor network 16. A pair of analog multiplexers 24A and 24B operate to connect a selected group of the fine differential reference voltages to the fine comparator bank 20. The particular group selected is determined by the outputs of the coarse comparator bank 12, as will be described later in greater detail.

The outputs of the fine comparator bank 20 are encoded by fine encoder logic circuitry 26. The encoder logic circuitry 26 encodes the five LSBs of the ADC together with a Decrement output and an Increment output, with the later two outputs being used for error correction, as will be explained. The five LSBs are received by error correction logic circuitry 28. The error correction logic circuitry 28 further receives the five MSBs from coarse encode logic circuitry 18 after having been delayed one clock cycle by delay circuit 30. As will be explained, the MSBs are produced one clock cycle earlier than the LSBs since the analog multiplexers 24A and 24B used in producing the LSBs require a control input from the coarse comparator bank 12. The ten bit output of the ADC is then transferred from the error correction logic circuitry 28 to an output register 32.

Figure 3:
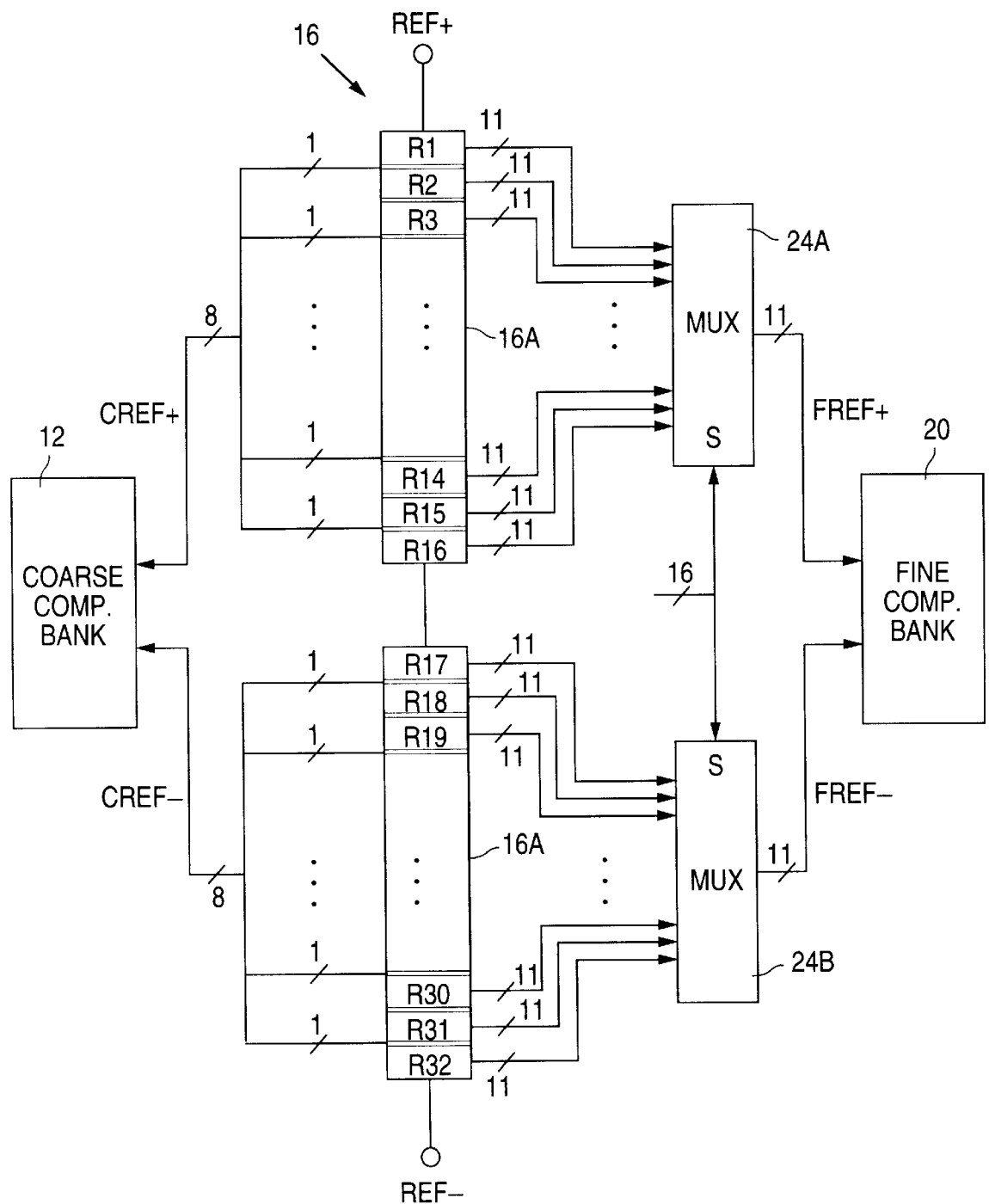
FIG. 3 is a schematic diagram of a portion of the FIG. 1 ADC, showing the manner in which the fine comparator and coarse comparator banks are connected to receive coarse and fine differential reference voltages, respectively, produced by a resistor network.

The resistor network 16 used for producing the coarse and fine differential reference voltages is comprised of 256 resistors connected in series between positive reference voltage REF+ and negative reference voltage REF− which are set at +3.5 and +1.5 volts, respectively, in the exemplary embodiment. FIG. 3 is a schematic diagram of resistor network 16 and some of the associated circuitry including the coarse comparator bank 12 and the fine comparator bank 20. The analog signal inputs CIN+, CIN−, FIN+ and FIN− to the comparator banks 12 and 20 are not shown. The resistor network 16 is divided into 32 identical resistor sections R1 through R32, with each resistor section including a total of 8 individual resistors. That half of the resistor network 16 closest to positive reference REF+, network segment 16A, produces the positive component of the coarse and fine differential reference voltages. The remaining half of the resistor network closest to negative reference voltage REF−, network segment 16B, produces the negative component of the coarse and fine differential reference voltages.

Figure 4:
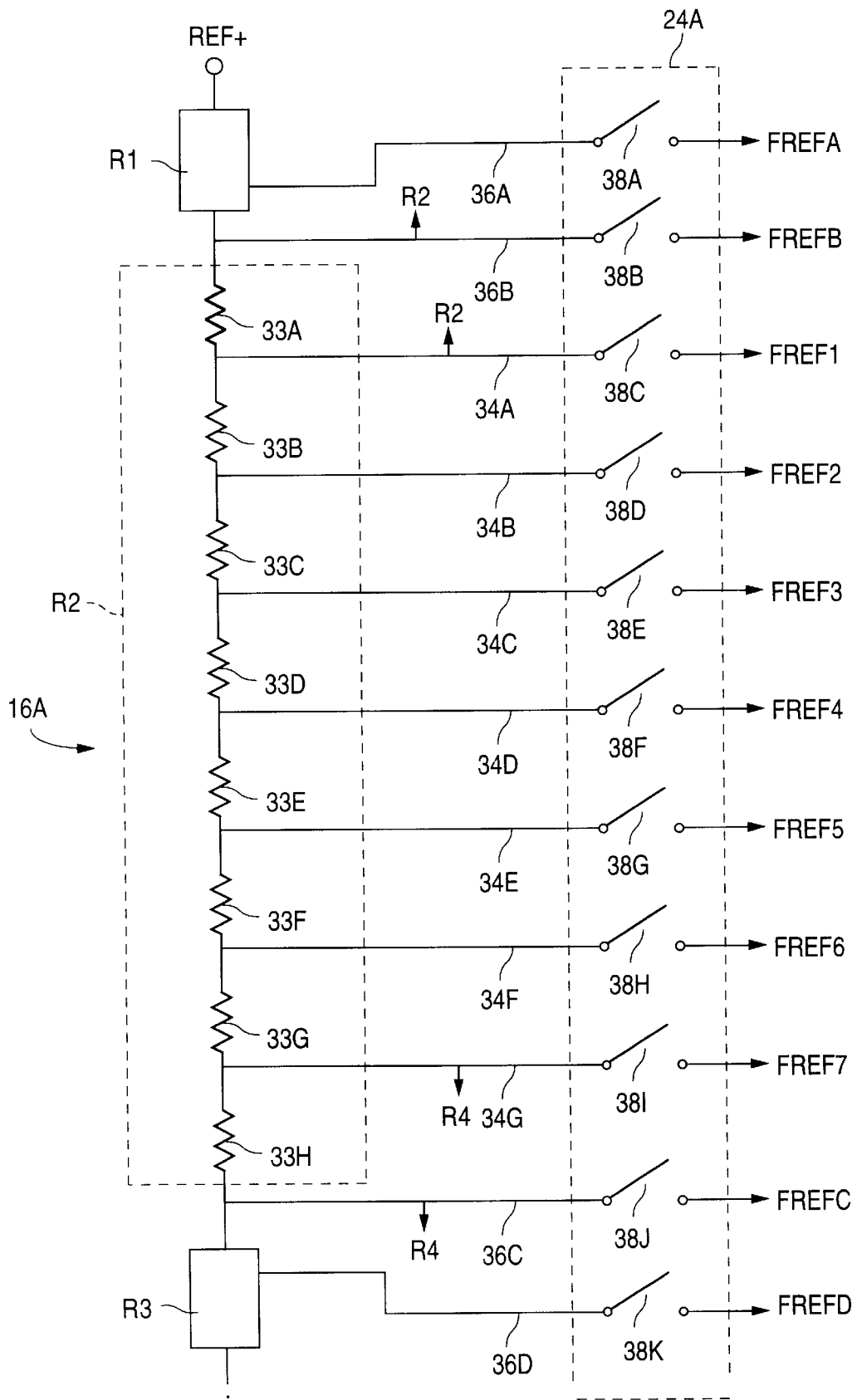
FIG. 4 is a diagram illustrating one section of the resistor network used for producing the differential reference voltages used in the FIG. 1 ADC.

FIG. 4 is a schematic diagram of one of the 32 resistor sections, exemplary section R2, and part of the analog multiplexer 24A associated with section R2. Resistor section R2 includes resistors 33A through 33H connected in series. Each resistor section has a total of eleven output lines which are connected to either analog multiplexer 24A or analog multiplexer 24B depending upon the position of the resistor section on the resistor network 16. The sixteen resistor sections nearest REF+, sections R1 through R16, produce what are termed the positive component of the fine differential reference voltages and are connected to the fine comparator bank 20 by way of multiplexer 24A. These sections also produce the positive component of the coarse differential reference voltages supplied directly to the coarse comparator bank 12. The sixteen resistor sections nearest the negative reference REF−, sections R17 through R32, produce what are termed the negative component of the fine differential reference voltages and are connected to the fine comparator bank 20 by way of multiplexer 24B.

As will be explained later in greater detail, the total number of different coarse and fine differential reference voltages produced by the resistor network 16 is lower than the number of comparators in the coarse and fine comparator banks 12 and 20. The comparator banks are implemented to carry out an interpolation operation thereby reducing the number of reference voltages that need to be produced. For every two coarse differential reference voltages produced by resistor network 16, the coarse comparator bank 12 performs an interpolation operation so that the network is not required to produce a third coarse reference voltage that falls intermediate the two reference voltages. For every two fine differential reference voltages that are produced by the network, the fine comparator bank 20 performs an interpolation operation so that the resistor network is not required to produce three fine differential reference voltages that fall intermediate the two reference voltages.

Referring back to FIG. 4, there are a total of eleven lines associated with each resistor section. Seven of the lines, lines 34A through 34G, carry one component of the primary fine reference voltages which are produced at the seven nodes intermediate the eight resistors that make up the resistor section. Lines 36A and 36D carry redundant fine reference voltages used by the fine comparator bank 20 for error correction. Lines 36B and 36C are used both for error correction and used as some of the reference voltage inputs for carrying out the interpolation operation by the non-error correction comparators of the fine bank. Line 36A is connected to a node in resistor section R1 intermediate the first and second resistors in the lowest position in the section. This node in resistor section R1 corresponds to the node intermediate resistors 33G and 33H of resistor section R2. Line 36D is connected to a node in resistor section R3 intermediate the two resistors in the highest position in the section. This node in resistor section R3 corresponds to the node intermediate resistors 33A and 33B of resistor section R2.

The eleven fine reference voltages (the positive component of eleven fine differential reference voltages) associated with each resistor segment 16A are supplied to eleven non-consecutive comparators of the forty-one fine comparators of bank 20 by way of analog multiplexer 24A. The eleven fine reference voltages (the negative component of the eleven fine differential reference voltages) associated with each network segment 16B are supplied to the same eleven non-consecutive comparators by way of analog multiplexer 24B. The remaining thirty comparators of the fine bank 20 rely upon interpolation in lieu of actual reference voltages produced by network 16.

As will be explained in greater detail, the fine comparator bank 20 operates on differential inputs FIN− and FIN+ of a single polarity. Thus, only fine differential reference voltages of a single polarity are required by the fine comparator bank 20. The coarse comparator bank 12 operates on differential inputs CIN− and CIN+ of both polarities. Thus, fifteen of the thirty-one coarse comparators utilize coarse differential reference voltages that are positive and fifteen use differential reference voltages that are negative. The thirty-first coarse comparator measures inputs that are mid-polarity. Inverting a differential reference voltage is readily accomplished by reversing the connection. Thus, the resistor network will produce eight coarse reference voltages (CREF+ and CREF−) that are connected to eight coarse comparators that use positive differential voltages. The remaining seven coarse comparators that would otherwise use positive differential reference voltages produced by network 16 operate with the first eight comparators using interpolation. The eight positive differential reference voltages are converted to eight negative differential reference voltages by reversing the connections. The resultant eight negative coarse differential reference voltages are connected to eight of the coarse comparators that use negative differential reference voltages. The remaining seven coarse comparators that would otherwise use negative differential reference voltages operate with the first seven comparators using interpolation.

The thirty-one fine comparators of bank 20 produce the five LSBs of the FIG. 1 converter, with the remaining ten comparators being devoted to error correction. Of the thirty-one comparators that produce the LSBs, seven comparators receive reference voltages directly from resistor network 16 (lines 34A through 34G). The remaining twenty-four of the comparators that produce the LSBs operate using interpolation. Four of the ten error correction comparators of bank 20 receive reference voltages directly from the network 16 (lines 36A, 36B, 36C and 36D), with the remaining six operating using interpolation. The thirty-one comparators of the coarse bank 18 all are devoted to producing the five MSBs of the converter and none are used for error correction.

The analog multiplexers 24A and 24B are comprised of identical switching circuitry associated with each of the 32 resistor sections RI through R32 that make up the resistor network 16 (FIG. 3). The switching circuitry associated with section R2 is shown in FIG. 4 and includes switches 38C through 38I connected to receive the seven primary fine reference voltages on lines 34A through 34G, respectively. Also included are four switches 38A, 38B, 38J and 38K connected to receive the four redundant fine reference voltages on lines 36A through 36D, respectively. The switches are preferably implemented using a complementary MOS transistor pair driven by complementary signals.

As will be described in greater detail, over a period of three consecutive clock intervals, the coarse comparator bank 12 will have completed the compare operation used to produce the five MSBs of the converter. This is accomplished by comparing the differential input CIN+ and CIN− (FIG. 1) with each of the coarse differential reference voltages produced by the resistor network 16 and by interpolation. As previously noted, one component of the coarse differential reference voltages is produced by resistor sections R1 through R16 of the resistor network 16 and the other component is produced by resistor sections R17 through R32 of the network.

All outputs of coarse comparator having an input CIN+ and CIN− which is less than the particular coarse differential reference voltage applied to the comparator will have a "0" output. The remaining coarse comparator outputs will be a "1" indicating that input CIN+ and CIN− is greater than the coarse differential voltages applied to those comparators. As previously noted, the outputs of the coarse comparator bank 12 are used both to determine the five MSBs of the ADC and to determine which set of fine differential reference voltages will be connected to the fine comparator bank 20 by way of analog multiplexers 24A and 24B.

The foregoing can be further illustrated by way of an example. Assume that differential input CIN+ and CIN− is less than the particular coarse differential reference voltage having one component produced at the node intermediate resistor sections R1 and R2 (FIG. 3) and the other component at the node intermediate R31 and R32. The coarse comparator associated with the coarse differential reference voltage produced at the two nodes will thus have a "0" output. Further assume that input CIN+ and CIN− is greater than the next smaller coarse differential reference voltage. This smaller reference voltage is not actually produced by network 16 since interpolation is used in lieu of producing the voltage. However, the coarse comparator that operates as if it received this reduced coarse differential reference voltage will have a "1" output, as will all of the remaining coarse comparators.

Input CIN+ and CIN− thus has a magnitude which falls intermediate the first coarse differential voltage produced at the node intermediate R1 and R2 and the node intermediate R31 and R32 and the next smallest coarse differential voltage which would otherwise be produced at the node intermediate R2 and R3 and the node intermediate R30 and R31 absent the use of interpolation. This means that the input CIN+ and CIN− has a magnitude which falls within the range of fine differential reference voltages produced by resistor sections R2 and R31. Thus, the fine differential reference voltages produce by resistor section R2 and section R31 will be used by the fine comparator bank 20 to determine the five LSBs. That is assuming that the coarse comparator bank 12 has not made an error.

The outputs of the coarse comparator bank 12 are used to control the analog multiplexer 24A so as to connect the eleven fine reference voltages of resistor section R2 and to control the analog multiplexer 24B so as to connect the eleven fine reference voltages of resistor section R31 to the comparators of the fine comparator bank 20. Thus, switches 38A through 38K (FIG. 4) of the analog multiplexer 24A are turned on, with the remaining switches of multiplexer 24A connected to the other resistor sections being turned off. Similarly, the switches of multiplexer 24B (FIG. 3) associated with resistor section R31 are turned on, with the remaining switches of the multiplexer connected to the other resistor sections being turned off. Thus, eleven fine differential reference voltages selected by the five MSBs are forwarded to the fine comparator bank 20.

The coarse comparator bank 12 outputs are used to generate the five MSBs of the ADC and to select the proper fine differential reference voltages for use by the fine comparator bank. In the event an error is made by the coarse comparator bank, the five MSBs will be incorrect and, in addition, multiplexers 24A and 24B will select the wrong set of fine differential reference voltages. As previously noted, ten of the forty-one fine comparators are used for error correction. Five of these fine comparators operate utilizing fine differential reference voltages associated with the resistor segment 16A/16B one position on network 16 outside the selected segment and the remaining five operate utilizing reference voltages associated with the resistor segment 16A/16B one position on network 16 inside the selected segment.

The foregoing can be further illustrated in reference to FIGS. 3 and 4. Assume that the coarse comparator bank 12 has caused multiplexer 24A to connect the positive component of the eleven fine reference voltages associated with segment R2 to the fine bank. If that is the case, multiplexer 24B will also connect the negative component associated with segment R31 to the fine bank. Five of the fine comparators used for error correction will operate with reference voltages associated with segments R1 and R32 and the remaining five error correction fine comparators will operate with reference voltages associated with segments R3 and R30.

FIG. 14 is a chart which contains all possible states of the ten fine error correction comparators. Outputs $E1^P$, $E2^P$, $E3^P$, $E4^P$ and $E5^P$ are the outputs of the comparators which operate with the reference voltages of the resistor segment immediately outside the selected segment and outputs $E1^N$, $E2^N$, $E3^N$, $E4^N$ and $E5^N$ are the outputs of the comparators which operate with the fine reference voltages of the segment immediately inside the selected segment. If the proper set of fine reference voltages have been selected by the coarse comparator bank 12, segments R2/R31 for example, the input FIN− and FIN+ being measured will have a magnitude which falls within the range of the selected set of fine differential reference voltages. In that event, all of the five comparators that operate with fine reference voltages associated with segments R1/R32 will have outputs $E1^P$ through $E5^P$ which are "0" and of the five comparators that operate with fine reference voltages associates with segments R3/R30 will have outputs $E1^N$ through $E5^N$ which are "1". As indicated by the chart of FIG. 14, this represents a "no error" condition.

Continuing with the example, if the reference voltages associated with resistor segments R1/R32 should have been selected but segments R2/R31 were actually selected, one or more of the comparator outputs $E1^P$ through $E5^P$ will be a "1", with outputs $E1^N$ through $E5^N$ remaining all "1"s. Similarly, if the reference voltages associated with resistor segments R3/R30 should have been selected, one or more of the comparator outputs $E1^N$ through $E5^N$ will be a "0", with outputs $E1^P$ through $E5^P$ remaining all "0"s.

If the error made by the coarse comparator bank 12 is not too large, a correction can be carried out. In addition, the resultant erroneous MSB output can be corrected by one in either direction by performing an increment/decrement step as mentioned earlier in connection with the fine encoder logic circuitry 26 of FIG. 1. If the state of the fine comparator outputs $E1^P$ through $E5^P$ differ from one another, it is known that the input FIN+ and FIN− falls within a range defined by certain ones of the fine reference voltages associated with the resistor segment located outside the erroneously selected segment. As can be seen from the FIG. 14 chart, the LSB can be corrected by adding 1 though 4 to the fine comparator bank 20 output, depending upon the actual state of $E1^P$ through $E5^P$. Similarly, if the state of comparator outputs $E1^N$ through $E5^N$ differ from one another, it is known that the input FIN+ and FIN− falls within a range defined by certain ones of the fine reference voltages associated with the resistor segment located inside the erroneously selected segment. In that case, depending upon the state of $E1^N$ through $E5^N$, the LSB can be corrected by subtracting 1 through 4 as indicated in the FIG. 14 chart. If the error is too large in either direction, meaning that outputs $E1^P$ through $E5^P$ and outputs $E1^N$ through $E5^N$ are all the same state, there is insufficient information to correct the error, although the fact that an error has occurred is known. Additional error correction comparators could be utilized to provide a wider range of correction.

Figure 5:
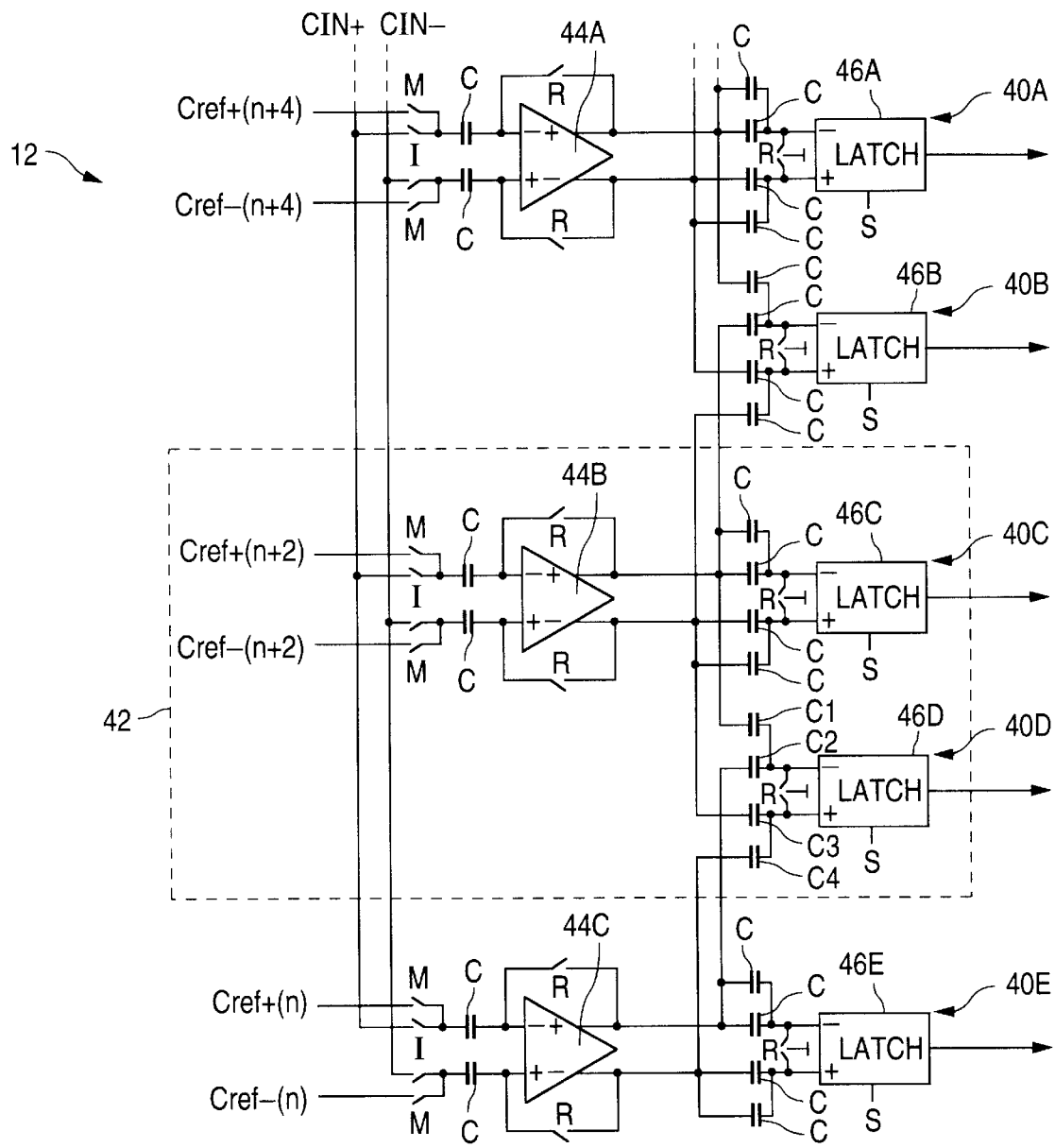
FIG. 5 is a schematic diagram of one basic unit of the coarse comparator bank used in the FIG. 1 ADC.

Further details of the coarse comparator bank 12 are depicted in FIG. 5. As previously noted, the coarse comparator bank 12 includes a total of thirty-one comparator circuits 40, with the bank being configured to perform an interpolation so that resistor network 16 is required to provide only a total of 16 different coarse differential reference voltages CREF+ and CREF−. FIG. 5 shows five exemplary comparators, including comparators 40A through 40E. The coarse comparator bank 12 includes a basic unit 42 which implements two comparators 40, such as comparators 40C and 40D, with there being a total of 15 of the basic units. A single comparator 40E, not part of the basic unit 40, brings the total number to thirty-one.

Comparators 40A, 40C and 40E of FIG. 5 each include a fully differential preamplifier 44A, 44B and 44C, respectively. The preamplifiers have a relatively low open loop gain, a gain of seven for example, so that high speed, low power operation is achieved. Referring to exemplary comparator 40E, a first switch $R_c$ is connected between the inverting input and non-inverting output and a second switch $R_c$ is connected between the non-inverting input and inverting output of each of the preamplifiers 44. A pair of capacitors C is included, with a first capacitor having one side connected to the inverting input and a second side to one side of upper switches $M_c$ and $I_c$ and a second capacitor having one side connected to the non-inverting input and a second side connected to a different set of lower switches $M_c$ and $I_c$. Upper switch $I_c$ is connected to receive the positive component CIN+ of the differential input being measured, with lower switch $I_c$ being connected to receive the negative component CIN− of the input.

Upper switch $M_c$ is connected to receive a positive component CREF+ (n) of one of the coarse differential reference voltages produced by resistor network 16 and lower switch $M_c$ is connected to receive the negative component CREF− (n).

The non-inverting output of preamplifier 44C is connected to the inverting input of a latch circuit 46E by way of a parallel combination of two capacitors C. All capacitors C of FIG. 5 are of the same value so that the parallel combination will double the effective capacitance. The inverting output of preamplifier 44C is connected to the non-inverting input of latch 46E by way of a second parallel combination two capacitors C. A switch $R_c$ is connected so as to short the latch inputs to a common mode input voltage, as will be explained.

Figure 6A:
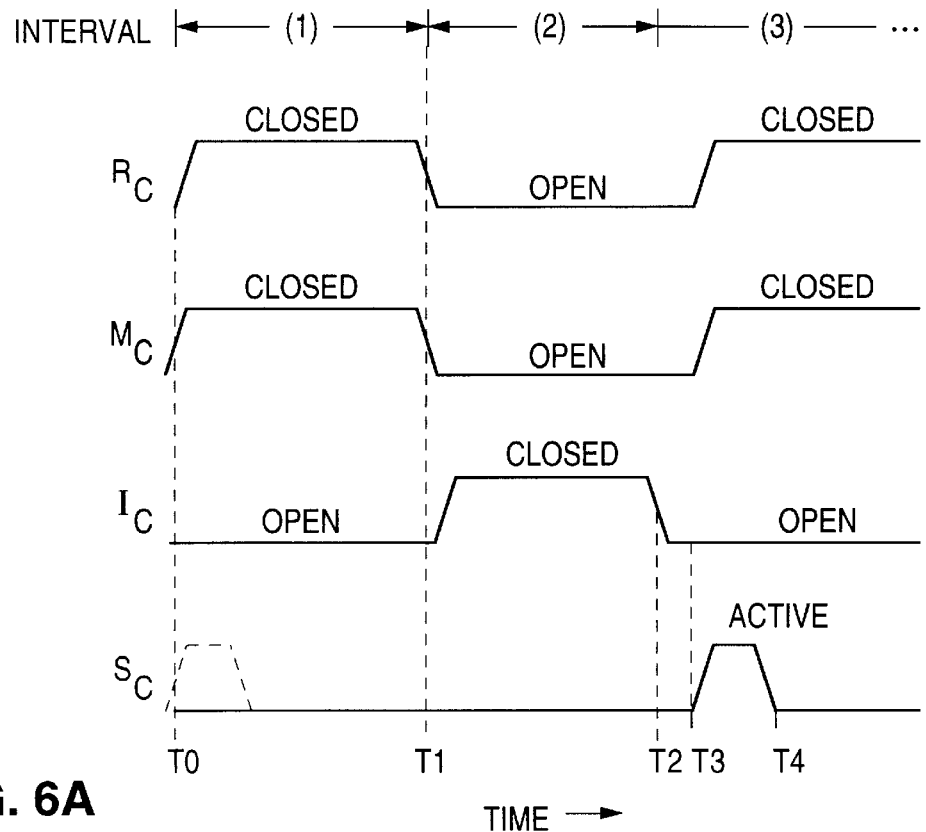
FIGS. 6A and 6B are timing diagrams illustrating the operation of the coarse and fine comparator banks, respectively, used in the FIG. 1 ADC.

The operation of comparator 40E will now be described in connection with the timing diagram of FIG. 6A together with FIG. 5. FIG. 6A shows three consecutive clock intervals. The timing is not shown to scale. Switches 14A and 14B (FIG. 1) are closed only when the coarse comparator bank 12 is measuring input CIN− and CIN+ in order to reduce capacitive loading on the output of sample and hold amplifier circuit 10. The latch circuits, such as latch circuit 46E (FIG. 5), are implemented such that the desired input common mode operating voltage is maintained by periodically applying the desired voltage to both latch inputs. Thus, at time T0, switches $R_c$ connected to the respective inputs of latch 46E are closed so as to connect the inputs to a voltage source (not depicted) set to the desired common mode input voltage.

Continuing, the two switches $R_c$ connected across preamplifier 44C short the inverting and non-inverting inputs of the preamplifier to the non-inverted and inverted outputs, respectively. This causes the inputs and the side of capacitors C connected to the inputs to be at the threshold voltage of the preamplifier. At the same time, switches $M_c$ are both closed thereby connecting upper capacitor C to the positive component CREF+ (n) of one of the coarse differential reference voltages and connecting the lower capacitor C to the negative component CREF− (n) of the coarse differential reference voltage. At this time, upper and lower switches $I_c$ remain open. Thus, a charge is transferred to upper and lower capacitors C indicative of the magnitude of component CREF+ (n) of the coarse differential reference voltage and component CREF− (n) of the voltage, respectively.

During the second interval beginning at time T1, switches $R_c$ and $M_c$ are opened and switches $I_c$ are closed. Note that the inputs of latch 46E will remain at the desired common mode input voltage due to the parasitic capacitances associated with the input. Upper capacitor C is thus connected to input CIN+, with the final charge being indicative of the algebraic difference between CIN+ and CREF+. Further, lower capacitor C is connected to CIN−, with the final charge on the lower capacitor being indicative of the algebraic difference between CIN− and CREF−. Open loop preamplifier 44C produces a differential voltage equal to the amplified difference between differential input CIN+ and CIN− and differential input CREF+ and CREF−.

The positive output of preamplifier 44C charges upper parallel capacitors C and the negative output charges lower parallel capacitors C so that the inputs to latch 40E will be equal to the amplified difference between inputs CIN+ and CIN− and CREF+ and CREF−.

At the beginning of the third time interval, time T3, strobe signal $S_c$ goes active causing latch circuit 40E to hold a digital output indicative of the relative magnitude of the inputs to the latch circuit. At time T4, signal $S_c$ goes inactive, with the sequence being repeated for the next measurement. Latch circuit 40E includes internal switching circuitry (not depicted) which disconnects the inputs of the circuit from the external circuitry just prior to time T3 when $S_c$ goes active and just after time T4 when $S_c$ goes inactive. The input of the latch circuits possesses sufficient capacitance to hold the differential input voltage throughout the strobe period even though the input drive circuitry has been disconnected. The latch input is isolated so that switches $R_c$ and $M_c$ can be closed as part of the beginning of the next measurement, without adversely affecting the present measurement.

Those comparator circuits which have inputs connected directly to inputs CREF+ and CREF− and inputs CIN+ and CIN−, including comparator circuits 40A and 40C of FIG. 5, all operate in the same manner as comparator circuit 40E. The intermediate comparator circuits, including comparator circuits 40B and 40D, receive inputs from the adjacent comparator circuits so that an interpolation operation will be carried out. As will be explained, the differential outputs of the preamplifiers 44 of the two adjacent comparator circuits are subtracted from one another and, if the result is positive, the associated latch 46 will be set to a "1" and, if negative, set to a "0".

Intermediate comparator circuit 40D includes a first upper capacitor C1 connected to the positive output of preamplifier 44B and a second upper capacitor C2 connected to positive output of preamplifier 44C. Capacitors C1 and C2 operate to average the two preamplifier positive outputs. A first lower capacitor C3 is connected to the negative output of preamplifier 44B and a second lower capacitor C4 is connected to the negative output of preamplifier 44C. Thus, capacitors C3 and C4 also average the two preamplifier negative outputs. If the outputs of comparator circuits 40C and 40E are the same, the intermediate comparator circuit 40D will match them. If the comparator circuit 40C and 40E outputs differ, intermediate comparator circuit 40D will be either a "1" or a "0" depending upon the polarity of the difference between the differential outputs of preamplifiers 44B and 44C. The remaining intermediate comparator circuits operate in the same manner. This interpolation technique reduces the number of coarse reference voltages that need to be produced by resistor network 16.

Figure 7:
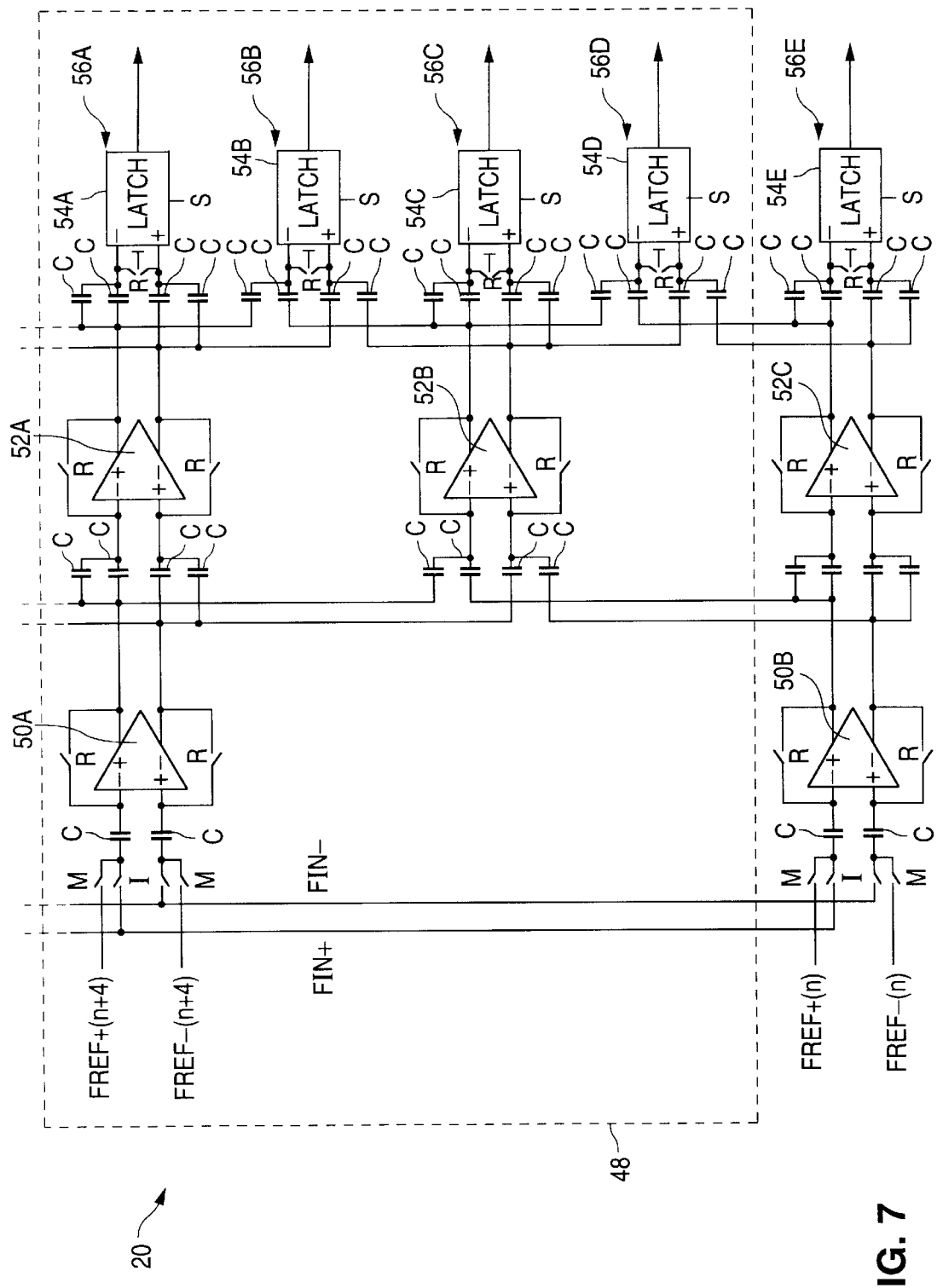
FIG. 7 is a schematic diagram of one basic unit of the fine comparator bank.

FIG. 7 shows further details relating to the manner in which the comparator circuits which make up the fine comparator bank 20 are implemented. The fine comparator bank 20 includes ten basic comparator units 48, with each unit including four comparators, such as comparator circuits 56A through 56E. A single comparator circuit 56E brings the total number to 41. Comparator circuit 56E is connected directly to the differential input FIN+ and FIN− and to one of the fine differential reference voltages FREF+ (n) and FREF− (n). The fine comparator circuit 56E includes two preamplifiers 50B and 52C to provide additional gain which improves the accuracy of the fine comparator bank 20. The coarse comparator bank 12 uses fewer preamplifiers and thus has lower gain. However, the coarse bank incorporates error correction to offset the lower gain.

Other than the additional preamplifier, the fine comparator circuit 56E operates in the same manner as circuit 40E (FIG. 5) of the coarse comparator circuit. As will be explained in greater detail, the absolute value circuit 22 is configured to be connected to the output of the sample and hold amplifier circuit 10 only when the fine comparator bank is making a measurement, otherwise circuit 22 is disconnected so as to reduce the capacitive loading on the output.

Figure 6B:
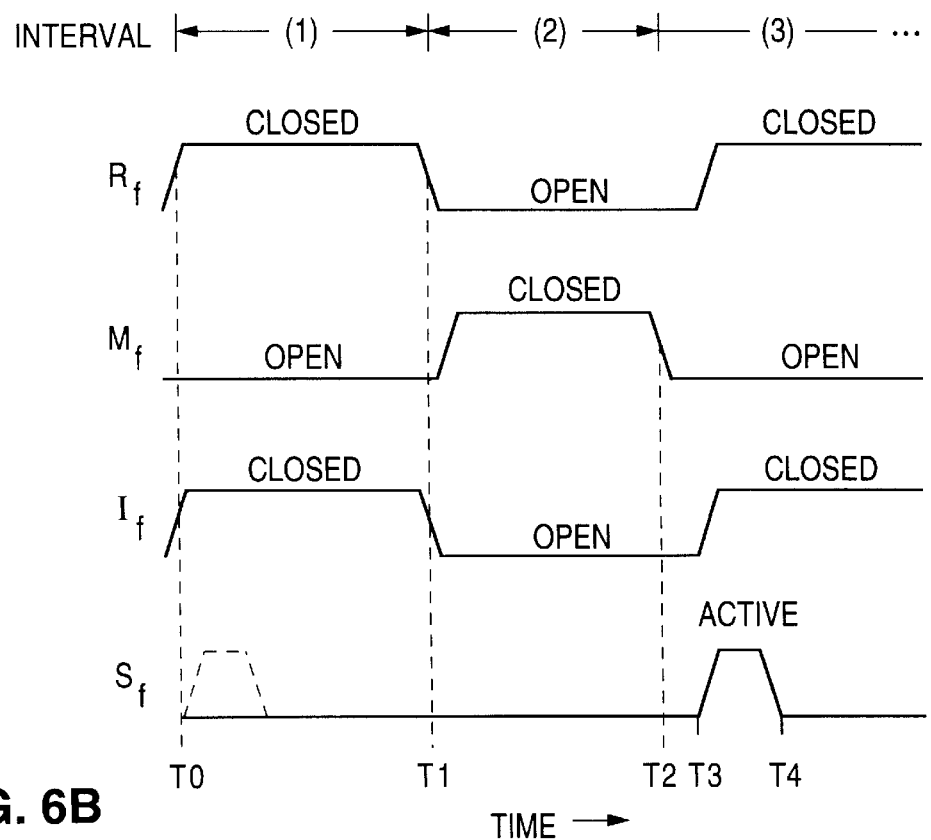

As indicated by the timing diagram of FIG. 6B, the timing of the operation of the fine comparator bank 20 is similar to that of the coarse comparator bank 12 except that the order that switches $M_f$ and $I_f$ are closed is reversed. Switches $I_f$ are closed first at time T0 so that capacitors C are first charged by differential input components FIN+ and FIN−, respectively. This is followed by closure of switches $M_f$ at time T1 so that capacitors C are then connected to the inputs FREF+ and FREF− that are provided by the analog multiplexers 24A and 24B. The result is that upper capacitor C ends with a charge indicative of the algebraic difference between the positive components FREF+ and FIN+ and lower capacitor C ends with a charge indicative of the algebraic difference between the negative components FREF− and FIN−.

Comparator circuit 56C is not connected directly to the inputs FIN+ and FIN− and reference voltage FREF+ and FREF−, but rather relies upon interpolation. Comparator circuit 56C is driven by the outputs of preamplifier 50A and preamplifier 50B. The two upper capacitors C connected to the inverting input of preamplifier 52B algebraically combine the positive components of the differential outputs of preamplifiers 50A and 50B, with the two lower capacitors C connected to the non-inverting input of preamplifier 52B algebraically combining the negative components of the two preamplifiers 50A and 50B. The output of preamplifer 52B is connected to latch 54C in the same manner as comparator circuit 56E. Thus, comparator circuit 56C performs an interpolation function in the same manner as coarse comparator circuits 40B and 40D (FIG. 5). The output of comparator circuit 56C is a "1" or a "0" depending upon the polarity of the difference between the differential output of preamplifier 50A and the differential amplifier 50B.

Comparator circuit 56B performs a further interpolation function, with the input of the comparator circuit being driven by the outputs of preamplifiers 52A and 52B. Thus, the output of comparator circuit 56B will be a "1" or a "0", depending upon the polarity of the difference between the differential output of preamplifiers 52A and 52B. Comparator circuit 56D performs a similar further interpolation function on the outputs of preamplifiers 52B and 52C.

The interpolation technique used by the coarse and fine comparator banks 12 and 20 reduces the number of resistors that need to be used to implement resistor network 16. The input capacitances of the two comparator banks are also reduced due to the reduced number of preamplifier inputs that need to be driven. With respect to the fine comparator bank 20, interpolation also reduces the number of individual switches needed to implement the analog multiplexers 24A and 24B thereby simplifying the multiplexers and reducing the capacitances associated with the multiplexers.

Figure 8:
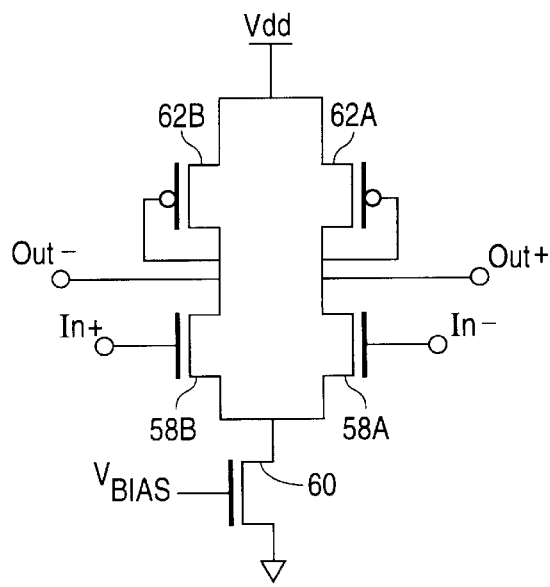
FIG. 8 is a schematic diagram of the preamplifiers used in the coarse and fine comparator banks of the FIG. 1 ADC.

FIG. 8 is a schematic diagram of the preamplifiers, such as preamplifier 44A (FIG. 5) and preamplifier 52B (FIG. 7), used in the coarse and fine comparator banks 12 and 20, respectively. The preamplifiers include a differential pair of N-type transistors 58A and 58B, with a third N-type transistor 60 operating as a tail current source. Two diode-connected P-type transistors 62A and 62B operate as loads for the amplifier, with this type of load providing the desired lower gain and high speed operation.

The preamplifiers used in the coarse comparator bank 12 (FIG. 5), including preamplifiers 44A, 44B and 44C, are implemented to operate at relatively reduced current levels, as are the second stage preamplifiers of the fine comparator bank 20 (FIG. 7), including preamplifiers 52A, 52B and 52C. The input stage preamplifiers of the fine comparator bank 20, including preamplifiers 50A and 50B, operate at twice the current level as compared to the other remaining preamplifiers. In order to permit all of the preamplifiers to be biased at the same levels, the current densities for all of the preamplifiers are same. This is implemented by doubling the size of the tail current transistor 60, thereby doubling the current output, and doubling the size of the differential pair transistors 58B, 58C and the load transistors 62A, 62B, as compared to the lower current version of the preamplifier, to maintain the same current density.

The latch circuits 46 and 56 of the fine and coarse comparator banks can both be implemented using the same basic circuitry. Latch circuits used in the coarse comparator bank 12 are preferably implemented using relatively small geometry transistors compared to the latch circuits used in the fine comparator bank 20 so that high speed and low power consumption can be achieved. The small geometry devices will result in an increase in input offset voltages and the likelihood of resultant errors. These errors by the coarse comparator bank 12 are, however, acceptable due to the error correction feature of the fine comparator bank 20, as previously described.

Figure 9:
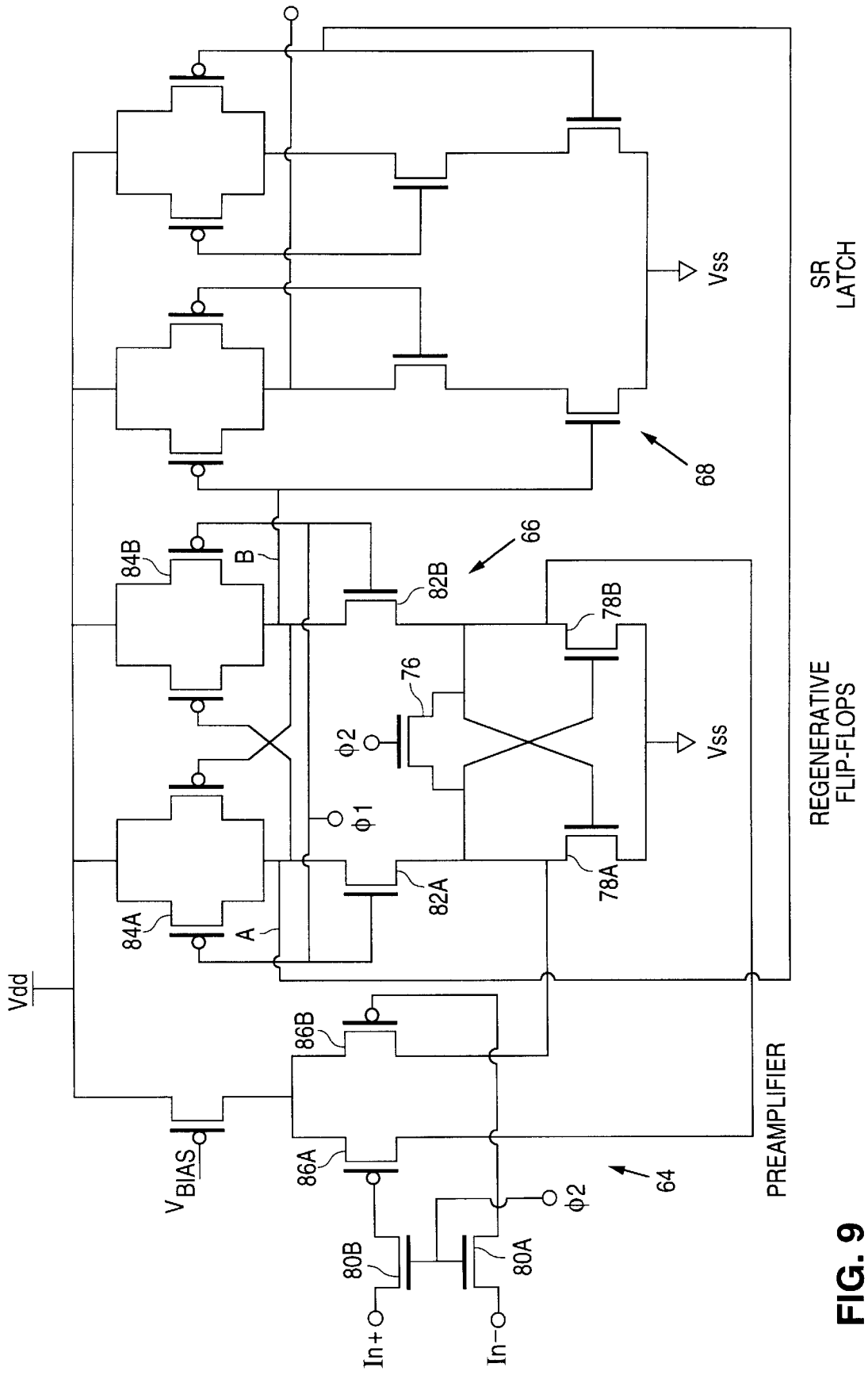
FIG. 9 is a schematic diagram of the latch circuit used in the coarse and fine comparator banks of the FIG. 1 ADC.

FIG. 9 is a schematic diagram of the latch circuits, sometimes referred to as a comparator circuit, used in the fine and coarse comparator banks. The latch circuit includes a preamplifier input stage 64 which drives a pair of regenerative flip-flops 66. The flip-flops drive an SR latch 68. The operation of the FIG. 9 latch circuit is described in "A High-Speed CMOS Comparator with 8-b Resolution" by G. M. Yin et al., IEEE Journal of Solid State Circuits, Vol. 27, No. 2, February, 1992, pp 208–211, the contents of which are fully incorporated herein by reference. The latch circuit utilizes a pair of clocks $\phi 1$ and $\phi 2$. Clock $\phi 1$ is the same as the strobe signal $S_f$ and $S_c$ shown in the FIG. 6A and 6B timing diagrams. Clock $\phi 2$ is essentially the complement of clock $\phi 1$, with clocks $\phi 1$ and $\phi 2$ being non-overlapping so that the rising edge of one clock is delayed from the falling edge of the other clock.

The latch circuit of FIG. 9 operates in a reset mode followed by a regeneration mode. During the reset mode, clock $\phi 2$ is high thereby causing transistor 76 to be conductive. Transistor 76 has a sufficiently high on resistance to permit a first flip-flop, which includes transistors 78A and 78B, to be driven a small amount in one direction or another. This permits the voltages at the drains of transistors 78A and 78B to be driven to different levels by the output of the preamplifier input stage 64. The high clock $\phi 2$ also operates to maintain transistors 80A and 80B in a conductive state so that the inputs In+ and In− will be connected to the comparator input preamplifier 64. Clock $\phi 1$ is low at this time so that transistors 82A and 82B will be off thereby isolating the lower latch from the upper latch. Transistors 84A and 84B will be conductive, thereby holding the upper latch in a reset mode. The inputs In+ and In− to the latch circuit of FIG. 9 are applied to the gates of the differential pair of transistors 86A and 86B that make up the preamplifier stage 64 by way of conductive pass transistors 80A and 80B. The differential output of the preamplifier 64 is connected to the input of the lower latch so that there will be an imbalance applied to the latch. When clock $\phi 2$ goes low, followed after a short delay by clock $\phi 1$ going high, transistor 70 goes off thereby releasing the lower latch. Input pass transistors 80A and 80B will turn off, but the state of the preamplifier stage 64 will remain unchanged due to the intrinsic capacitance present at the gates of transistors 86A and 86B. Thus, any further changes in inputs In+ and In– as part of the sequence for conducting a subsequent comparison will not affect the state of the comparator.

With transistor 70 off, the lower latch will be in an astable, high gain, state so that it can be set to one state or the other by the preamplifier stage 64 output. Clock φ1 going to a high state will turn off transistors 84A and 84B and thereby release the upper latch. Transistors 82A and 82B will turn on so as to connect the upper and lower latches together, with both latches driving one another in a high gain regenerative state. The output of the two regenerative latches or flip-flops, nodes A and B, will quickly be driven to opposite states near the supply voltages Vss and Vdd. The node A and B outputs are then used to set SR latch 68 thereby ending the compare operation.

Figure 10:
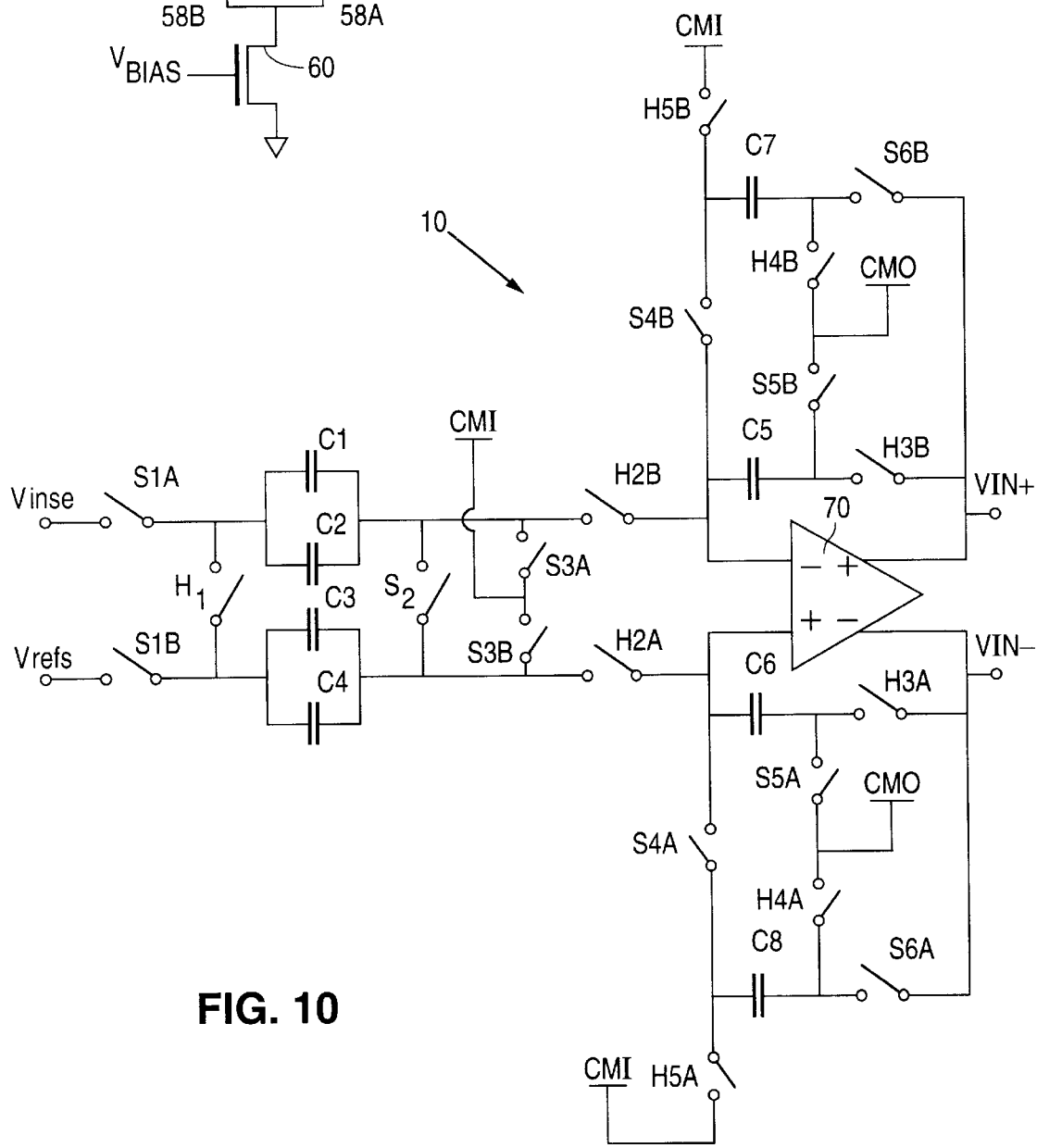
FIG. 10 is a schematic diagram of the sample and hold amplifier circuit used in the FIG. 1 ADC.
Figure 12:
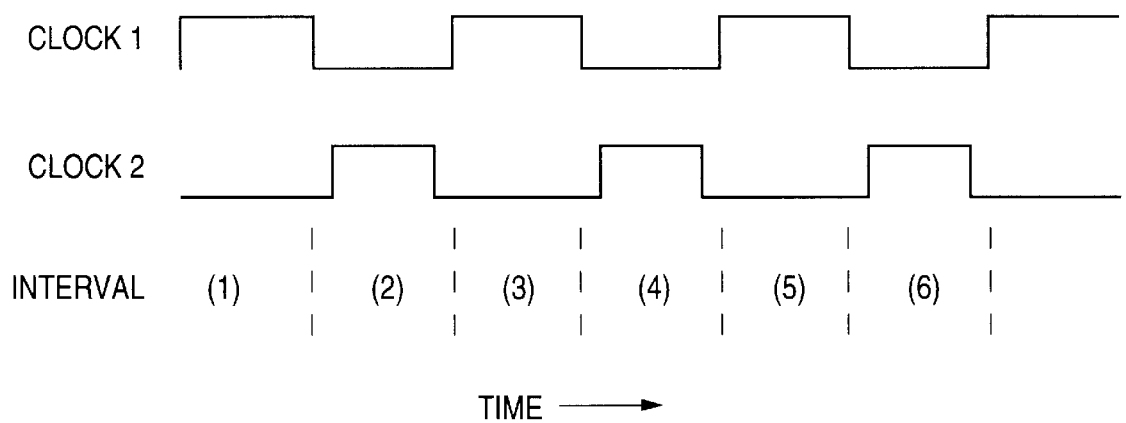
FIG. 12 is a timing diagram used in describing the operation of the FIG. 10 sample and hold amplifier circuit.

Details regarding the construction and operation of the sample and hold amplifier circuit 10 are shown in FIG. 10. The circuit, generally designated by the numeral 10, is comprised of a fully differential amplifier 70 and capacitors C1 through C8, with all of the capacitors being of the same value. Circuit 10 further includes several analog switches which are controlled by a standard two-phase non-overlapping clocking scheme. FIG. 12 is a timing diagram showing non-overlapping Clock 1 and Clock 2.

The analog switches can each be implemented using a P-type and an N-type transistor connected in parallel, with one polarity of the clock being applied to the gate of the P-type transistor and an opposite polarity of the same clock being applied to the gate of the N-type transistor. However, as will be explained later, it is possible to implement some of the switches using only N-type transistors. As is well known, the P-type transistor half of the switch operates to conduct the signal being transferred when the signal is a high voltage, the N-type conducts the low voltages and both operate to conduct the intermediate voltages. The size of the voltages that appear on some of the switches is such that only N-type transistors need be used. Since N-type transistors are inherently more conductive than P-type devices for the same geometry, less die area is required to implement an N-type only switch and, more importantly, the associated capacitances are lower.

The state of the switches is depicted in Table 1 below for each of the sample phase and the hold phase. Switches that are closed in the sample phase are clocked by Clock 1 (and complement where required) and switches that are closed in the hold phase are clocked by Clock 2 (and the complement where required) a second one of the clock phases. Note that, although the expressions sample phase and hold phase are used, the subject circuit operates to continue to hold one input while sampling a new input.

TABLE 1

| SWITCHES | CLOCK PHASE | |
|---|---|---|
| | Sample | Hold |
| S1A; S1B | CLOSED | OPEN |
| H1 | OPEN | CLOSED |
| S2 | CLOSED | OPEN |
| S3A; S3B | CLOSED | OPEN |
| H2A; H2B | OPEN | CLOSED |
| H3A; H3B | OPEN | CLOSED |
| S4A; S4B | CLOSED | OPEN |
| H4A; H4B | OPEN | CLOSED |

TABLE 1-continued

| SWITCHES | CLOCK PHASE | |
|---|---|---|
| | Sample | Hold |
| S5A; S5B | CLOSED | OPEN |
| S6A; S6B | CLOSED | OPEN |
| H5A; H5B | OPEN | CLOSED |

As can be seen in FIG. 10, a single-ended analog input Vinse is connected to an input terminal of switch S1A. A reference voltage Vrefs, ideally set to the desired midpoint of the input Vinse voltage swing, is connected to an input terminal of switch S1B. Thus, for an input Vinse which varies between +1 and +3 volts, Vrefs should be set to +2 volts.

A node intermediate switches S3A and S3B is connected to a low impedance voltage source which outputs a voltage CMI which defines the desired common mode input voltage for differential amplifier 70. CMI is also selected to be a relatively low value so that certain ones of the switches can be implemented using only N-type transistors, the advantages of which were previously noted. Those switches are S2, S3A, S3B, H2A, H2B, S4B, S4A, H5A and H5B. Assuming a supply voltage of +5 volts, CMI is set to +1.5 volt in the present exemplary embodiment. A further voltage source outputs a voltage CMO connected to one node between switches S5A and H4A and a second node between switches S5B and H4B. Voltage CMO defines the desired common mode output voltage of amplifier 70. In the present example, if the output voltage swing of the sample and hold amplifier circuit 10 varies between +1.5 volts and +3.5 volts, voltage CMO is set to +2.5 volts. Note that this converts to a differential voltage swing between –2 volts and +2 volts. Voltage CMO, which is not required to have the same low output impedance as the voltage source for CMI, can be produced using a resistive voltage divider.

Figure 11A:
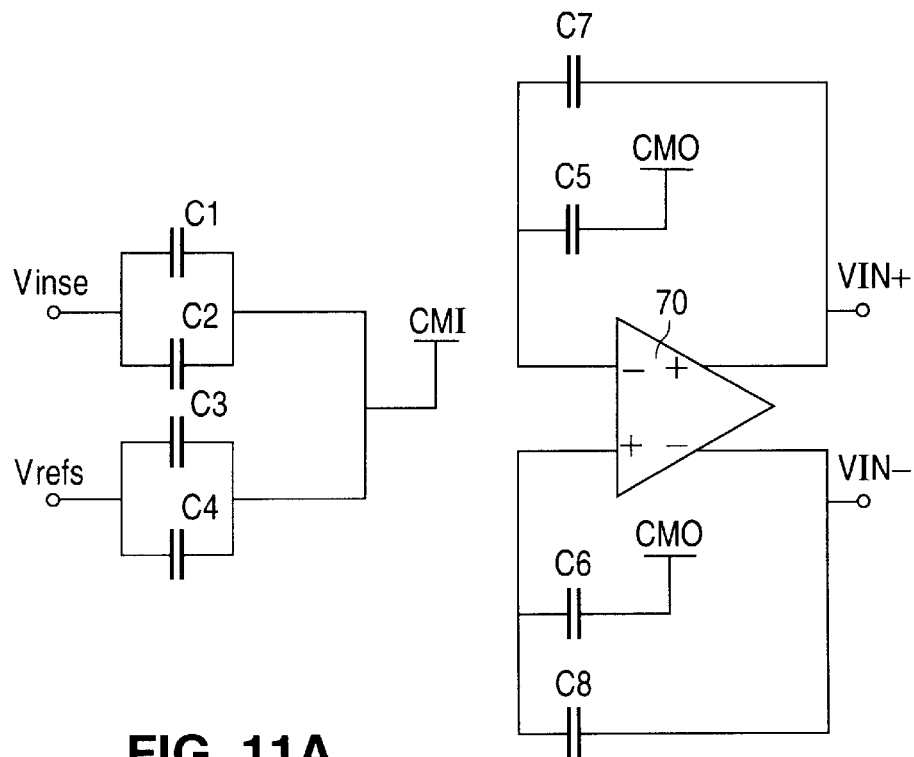
FIGS. 11A and 11B are equivalent circuits of the FIG. 10 sample and hold amplifier circuit in the sample and hold phases, respectively.

FIG. 11A shows an equivalent circuit for the sample and hold amplifier circuit 10 during the sample phase where the switch states are as depicted in Table 1. This occurs during interval (1) as shown in the FIG. 12 timing diagram. Since switches H2A and H2B are open, the sampling network, which includes input capacitors C1 through C4, is isolated from the amplification network, which includes amplifier 70 and hold capacitors CS through C8. A voltage equal to the difference between Vinse and CMI is developed across the parallel combination of capacitors C1 and C2. A voltage equal to the difference between Vrefs and CMI is developed across the parallel combination of capacitors C3 and C4.

The inner set of hold capacitors, C5 and C6, are both reset, with one terminal connected to the common mode output voltage CMO and the second terminal connected to the inverting and non-inverting input, respectively, of amplifier 70. Outer capacitors C7 and C8 have one terminal connected to the non-inverting and inverting inputs of amplifier 10, respectively, and the second terminals connected to the positive and negative differential outputs, respectively. The inputs of amplifier 70 will both be at the same voltage due to the high open loop gain of the amplifier. That voltage will be common mode input voltage CMI, for reasons that will be subsequently explained. For purposes of analysis, it is assumed that second terminals of capacitors C7 and C8 are at the same voltage, that is, VIN$^+$ and VIN$^{31}$ are the same. In fact, as will be explained, the VIN$^+$ and VIN$^-$ are at voltage determined by the previous sample phase.

At the end of the first sample phase, interval (1), all of the closed switches operating at voltage CMI, including switches S2, S3A and S3B, are opened, rapidly followed by the opening of the remaining closed switches, including switches S1A, S1B, S4A, S4B, S5A, S5B, S6A and S6B. As is well known, this staged sequence of opening switches significantly reduces signal-dependent charge injection. After a small further delay, Clock 2 goes high causing the open switches, including switches H1, H2A, H2B, H3A, H3B, H4A, H4B, H5A and H5B, to close thereby resulting in entry into the hold phase.

Figure 11B:
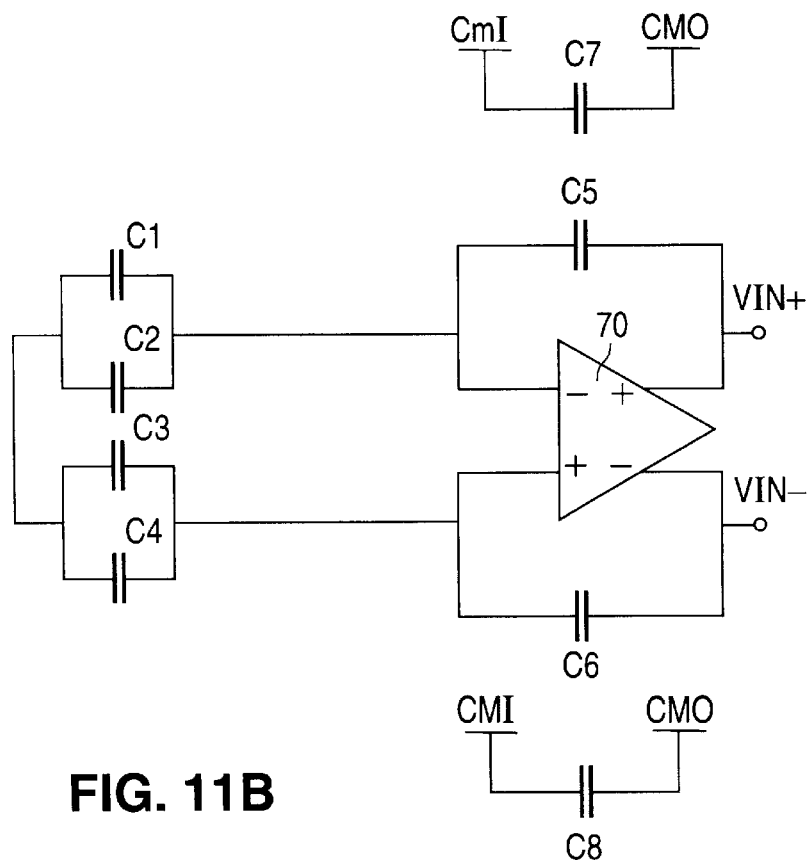

FIG. 11B shows the equivalent circuit of the sample and hold amplifier circuit 10 when the switches are placed in the hold phase as shown in Table 1. The input terminals of input capacitors C1, C2, C3 and C4 are shorted together by switch H1 (FIG. 10) so that the input terminals assume a voltage which is nominally half way between input Vinse and Vrefs. At the end of the sample phase (FIG. 11A) and just prior to entry into the hold phase, the total voltage drop across the series combination of capacitors C1/C2 and C3/C4 is equal to the difference Vinse and Vrefs.

The output terminals of capacitors C1 and C2 are connected to the inverting input of amplifier 70, with the output terminals of capacitors C3 and C4 being connected to the non-inverting input. The output terminals of capacitors C1, C2, C3 and C4 are at voltage CMI so that both inputs of differential amplifier 10, which are a high impedance, will be driven to voltage CMI. Capacitors C7 and C8 are disconnected from amplifier 70 and reconnected between voltages CMI and CMO. A charge transfer takes place from the parallel combination of input capacitors C1 and C2 and the parallel combination of C3 and C4 so that the total charge on the four capacitors will get split equally between feedback capacitors C5 and C6. Because the parallel input capacitance is twice that of the feedback capacitance, the voltage gain of the charge transfer is two. Assuming that the differential gain of amplifier 70 is high, the terminals of the feedback capacitors C5 and C6 connected to the inputs of the amplifier will be at the same voltage. Thus, the differential output voltage $VIN^+$ and $VIN^-$ will be equal in magnitude to twice the difference between Vinse and Vrefs and will be centered about voltage CMO.

The processing of the first sampled input is concluded during the next sample phase, interval (3). At the end of the previous hold phase, the input terminals of feedback capacitors C5 and C6 are connected to the inverting and non-inverting inputs, respectively, of amplifier 70 and are thus at the same voltage, as previously noted. The output terminals are at voltage $VIN^+$ and $VIN^-$, respectively, so that the total voltage drop across the loop which includes inner feedback capacitors C5 and C6 and the amplifier 70 inputs (which are at the same voltage) is the differential output voltage $VIN^+$ minus $VIN^-$.

At the beginning of the next sample phase, the beginning of interval (3) when Clock 2 goes low, the output terminals of capacitors C5 and C6 are disconnected from the amplifier 70 outputs. In addition, capacitors C7 and C8 are disconnected from voltage sources CMI and CMO. A short time later when Clock 1 goes high, capacitors C7 and C8 are connected between the inputs and outputs of amplifier 70 as shown in FIG. 11A. At the same time, the output terminals of capacitors C5 and C6 are connected to voltage source CMO thereby causing the charge on capacitor CS to be transferred to capacitor C7 and the charge on capacitor C6 to be transferred to capacitor C8.

Note that the voltage across CS during the sample phase (FIG. 11A), the difference between CMI and CMO, is the same voltage as across capacitor C7 during the hold phase (FIG. 11B). Similarly the voltage across C6 in the sample phase is the same as the voltage across C8 in the hold phase. Since capacitors C5 through C8 are the same value, it can be seen that all of the charge that was present on capacitor C5 in the hold phase is transferred to capacitor C7 in the sample phase and all of the charge on capacitor C6 in the hold phase is transferred to capacitor C8 in the sample phase. Accordingly, the output voltage of the sample and hold amplifier circuit 10 will remain unchanged during interval (3) while the new input Vinse is being sampled. This permits the sample and hold amplifier circuit 10 output to be measured by the fine comparator bank 20, by way of the absolute value circuit 22, following measurement by the coarse compare bank 12.

At the end of interval (3), the second input Vinse has been sampled. The differential output $VIN^+$ and $VIN^-$ which corresponds to the second input is held for further processing during both interval (4) and interval (5).

Figure 13:
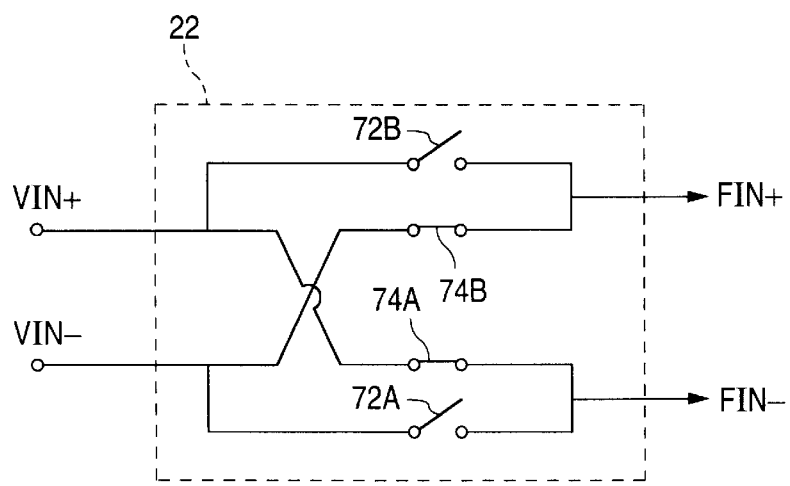
FIG. 13 is a schematic diagram of the absolute value circuit aspect of the present invention used in the FIG. 1 ADC.

The construction of the subject absolute value circuit 22 which converts the two polarity differential output VIN+ and VIN− of the sample and hold amplifier circuit 10 (FIG. 1) to a single polarity differential signal FIN+ and FIN− is shown in FIG. 13. Circuit 22 includes two pairs of analog switches, the states of which are determined by the polarity of the differential input VIN+ and VIN−. The switches include switch pair 72A and 72B and switch pair 74A and 74B. As previously noted, the MSB output of the coarse encoder logic 12 is indicative of the input polarity and is used by the absolute value circuit 22. When the MSB is a "1" thereby indicating a positive polarity switch pair 72A and 72B is closed and switch pair 74A and 74B is open. Thus, output FIN+ is VIN+ and output FIN− is VIN−. When the MSB is a "0", switch pair 72A and 72B is opened and pair 74A and 74B is closed. Thus, output FIN+ is VIN− and output FIN− is VIN+. As previously noted, switch pair 72A and 72B and switch pair 74A and 74B are both maintained in an open state when the fine comparator bank 20 is not making a measurement thereby reducing the capacitive loading on the output of the sample and hold amplifier circuit 10.

Overall operation of the subject ADC will now be given. Reference is made to the timing diagram of FIG. 2 together with the remaining figures. The processing of a single analog input Vinse sample occurs over six clock intervals as highlighted in the FIG. 2 timing diagram. As can be seen in FIG. 2, during the first interval (1), the sample and hold amplifier 10 samples the single-ended analog input Vinse. The actual sampling of Vinse will be the value as it exists near the end of the first interval. During the same interval, the comparators of the coarse comparator bank 12 are connected to resistor network 16 from T0 to T1 (FIG. 6A) so that the input capacitors C will be charged by the coarse differential reference voltages CREF+ and CREF−.

During the second time interval (2), the sample and hold amplifier circuit 10 converts the sampled single-ended input Vinse to differential output VIN+ and VIN− and holds the output. The output is connected to the coarse comparator bank 12 by way of switches 14A and 14B (FIG. 1) which produce output CIN+ and CIN−. These switches are closed only when needed to drive the coarse comparator bank 12. Switches 72A, 72B, 74A and 74B of the absolute value circuit 22 (FIG. 13) remain off during the intervals where the coarse comparator bank 12 is being driven. The coarse comparators complete the sampling of CIN+ and CIN− by the end of the second time interval, as indicated by the FIG. 6A timing diagram.

By the beginning of the third time interval, signal $S_c$ will go active (FIG. 6A) thereby strobing the coarse comparators and ending the compare operation by the coarse comparator bank 12. At the same time, switches $R_c$ and $M_c$ will again close as part of the next compare operation. Among other things, this will cause the coarse comparator bank 12 to be driven by the differential coarse reference voltages. Internal transistors 80A and 80B of the latch of the comparator circuit (FIG. 9) will be off thereby isolating the latch from the resultant changes in the comparator input IN+ and IN−. Further, during the third clock interval, switches 14A and 14B will be turned off thereby disconnecting the coarse comparator bank 12 from the output of the sample and hold amplifier circuit 10.

The output of the coarse comparator bank 12 is then used to control multiplexers 24A and 24B so that the appropriate fine differential reference voltages FREF+ and FREF− (FIG. 3) are connected to the comparators of the fine comparator bank 20. In addition, the sample and hold circuit 10 will switch from the hold phase (FIG. 11B) back to the sample phase (FIG. 11A). As previously described, the sample and hold amplifier circuit output VIN+ and VIN− will remain unchanged by virtue of the charge transfer between capacitors C5 and C7 and between capacitors C6 and C8. At the same time, the sample and hold circuit 10 will proceed to sample the next input Vinse as indicated by the FIG. 2 timing diagram.

The sample and hold circuit 10 output VIN+ and VIN− will also be converted to the absolute value differential output FIN+ and FIN− by switching on either switch pair 72A, 72B or 74A, 74B depending upon the polarity of the output, as previously determined by the coarse comparator bank 12. The fine comparator bank 20 then proceeds to sample the output FIN+ and FIN− of the sample and hold circuit 10.

As previously noted, the FIG. 6B timing diagram illustrates the operation of the fine comparator bank 20, with interval (1) of FIG. 6B being interval (3) of the FIG. 2 timing diagram. At the beginning of interval (3) of FIG. 2 and at time T0 of FIG. 6B, switches $I_f$ of the fine comparator bank 20 will be closed so that inputs FIN+ and FIN− will drive the bank. Switches $R_f$ will also be turned on to initialize the preamplifiers and comparators of the fine comparator bank 20.

During the time period that switches $R_f$ and $I_f$ are closed (T0 to T1 of FIG. 6B), the analog multiplexers 24A and 24B will have an opportunity to settle after having been switched. Such settling time is significantly reduced by virtue of the fact that the maximum voltage swing seen by the multiplexers 24A and 24B is reduced by one-half that it would otherwise be if the differential inputs FIN+ and FIN− were bipolar. If bipolar signals were to be measured, it would be necessary to provide each of the comparators of the fine comparator bank 20 with fine differential reference voltages of both polarities. This means that multiplexer 24A would have to have the capability of connecting fine differential reference voltages produced by network segment 16B (FIG. 3) to the fine comparator bank 20 and multiplexer 24B would have to have the capability of connecting the fine differential reference voltages produced by network segment 16A to the fine comparator bank. This would double the total voltage swing that would be seen by each of the multiplexers and would also double the number of switches needed to implement the multiplexers.

Returning to the FIG. 2 timing diagram, at the beginning of interval (4), the fine comparator bank 20 will be driven by the output of the analog multiplexers 24A and 24B which forward the selected fine differential reference voltage FREF+ and FREF− to the bank. This corresponds to time T1 of FIG. 6B which shows switches $M_f$ of the fine comparator bank 20 being closed thereby connecting the comparators to the outputs FREF+ and FREF− of the analog multiplexers 24A and 24B. In addition, switches 72A, 72B, 74A and 74B (FIG. 13) of the absolute value circuit 22 are all opened thereby disconnecting the circuit from the output of the sample and hold amplifier circuit 10. Further, a precharge operation is performed on the fine encoder logic 26 as is well known in the art.

As can also be seen from the FIG. 2 timing diagram, during time interval (4), the coarse comparator bank 12 is being driven by the output of the sample and hold amplifier circuit 10 as part of the subsequent measurement. This is the same operation that was previously carried out by the coarse comparator bank 12 in connection with the present measurement during interval (2). Note also that during interval (3), the analog multiplexers 24A and 24B are connecting the appropriate fine differential reference voltages to the fine comparator bank 20. However, the fine comparator bank does not utilize the reference voltages until interval (4). Thus, the multiplexers 24A and 24B have a significant amount of time to settle. This is an important advantage since the settling time of the multiplexers that connect the fine reference voltages presents a limitation on the operating speed of many subranging ADCs.

During time interval (5), the fine comparator bank 20 performs the final compare operation when signal $S_f$ is produced. As can be seen in FIG. 6B, this occurs at time T3. The fine encoder logic 26 and the error correction logic 28 perform their associated functions so that the five LSBs are produced. The five MSBs and the five LSBs are then loaded into the output register 32 thereby completing a single measurement. In addition, if the error correction circuitry determined that the coarse comparator bank 12 made an error and selected the incorrect resistor segment, the value of the five MSBs is either increased or decreased by one during interval (5). However, the digital output is not changed until the beginning of interval (6) where, as indicated by the FIG. 2 timing diagram, output register 32 is finally updated with the digital output representing the analog input sampled at the end of interval (1). As previously noted in connection with the FIG. 2 timing diagram, the disclosed ADC utilizes a pipelined architecture. Thus, different inputs are being simultaneously processed by the ADC thereby increasing the conversion rate of the ADC.

Thus, a novel absolute value circuit has been disclosed that provides many advantages. The absolute value circuit 22 reduces by 50% the voltage swing required at the output of multiplexers 24A and 24B. Furthermore, the parasitic output capacitances of the multiplexer outputs is reduced by 50%. The worst-case transient charge that is switched on to the sample and hold circuit 10 by the fine comparator bank 20 is also reduced by 50% thereby reducing the settling time of the sample and hold circuit significantly. The front-end sample and hold circuit 10 provides sustained dynamic performance for high input frequencies as compared to conventional subranging ADCs that rely upon the input capacitors of the comparator banks for sampling the input. The sample and hold circuit 10 further provides low input capacitance to the ADC together with single-ended to differential conversion. In addition, the fully differential implementation of the ADC provides greater immunity to digital noise thereby facilitating integration on a large digital integrated circuit. The fully differential implementation further provides a doubling of internal signal levels and suppression of charge injection and even-order harmonic distortion.

It should be noted that although one embodiment of the subject absolute value circuit has been described in some detail, it is to be understood that various changes can be made by those skilled in the art without departing from the spirit and scope of the present invention as defined by the appended claims.

What is claimed is:

1. An absolute value circuit for use in analog measurement apparatus, said circuit comprising:

a polarity detector configured to provide a polarity signal indicative of a polarity of a bipolar differential analog input signal having a first analog component and a second analog component;

an absolute value converter having first and second inputs which receive the first and second analog components, respectively, of the differential analog input signal and first and second outputs, with the absolute value converter operating to couple the first input to the first output and the second input to the second output when the polarity signal is in a first state and operating to couple the first input to the second output and the second input to the first output when the polarity signal is in a second state, different than the first state; and analog processing circuitry configured to process an analog signal of a single polarity, with the analog processing circuity coupled to the first and second outputs of the absolute value circuit converter.

2. The absolute value circuit of claim 1 wherein the polarity detector includes a first differential comparator circuit and a first reference voltage source of a plurality of bipolar differential reference voltages.

3. The absolute value circuit of claim 2 wherein the analog processing circuitry includes a second differential comparator circuit and a second reference voltage source of a plurality of unipolar differential reference voltages is coupled to the second differential comparator circuit.

4. The absolute value circuit of claim 3 wherein the analog processing circuitry includes analog switching circuitry configured to couple the second reference voltage source to the second differential comparator circuit.

5. The absolute value circuit of claim 4 wherein the analog switching circuitry includes a multiplexer circuit for coupling a selected one of the second reference voltage source outputs to the second differential comparator circuit.

6. The absolute value circuit of claim 5 wherein the multiplexer circuit couples the selected one of the second reference voltage sources based upon the polarity signal state.

7. An absolute value circuit for processing a bipolar analog input signal having a first analog component and a second analog component, said circuit comprising:

a polarity detector configured to produce a digital polarity signal indicative of a polarity of the bipolar analog input signal;

an absolute value converter circuit configured to pass the bipolar analog input signal when the polarity signal is in a first state and to reverse a polarity of the bipolar analog signal when the polarity signal is in a second state, opposite the first state, so as to provide a unipolar differential analog signal; and analog processing circuitry configured to process the unipolar differential analog signal.

8. The absolute value circuit of claim 7 wherein the digital polarity signal is stored during a period where the analog processing circuitry is processing the unipolar differential analog signal.

9. The absolute value circuit of claim 8 wherein the analog processing circuitry functions to process unipolar differential analog signals at a faster rate than bipolar analog signals.

10. An absolute value circuit for use in analog measurement apparatus, said circuit comprising:

a polarity detector configured to provide a polarity signal indicative of a polarity of a bipolar differential analog input signal having a first analog component and a second analog component;

an absolute value converter having first and second inputs which receive the first and second analog components, respectively, of the differential analog input signal and first and second outputs, with the absolute value converter operating to couple the first input to the first output and the second input to the second output when the polarity signal is in a first state and operating to couple the first input to the second output and the second input to the first output when the polarity signal is in a second state, different than the first state; and analog processing circuitry configured to process an output of the absolute value circuit and to provide a digital output indicative of a magnitude of the output of the absolute value converter and the state of the polarity signal.

11. An absolute value circuit for use in a measurement apparatus, said circuit comprising:

a unipolar circuit configured to receive a single-ended unipolar analog signal and to covert the unipolar analog signal to a bipolar differential analog signal;

a polarity detector configured to produce a polarity signal indicative of a polarity of the bipolar differential analog signal;

an absolute value converter configured to produce a unipolar differential analog signal from the bipolar differential analog signal in response to the polarity signal; and analog processing circuitry coupled to the absolute value converter and configured to process the unipolar differential analog signal.

12. The absolute value circuit of claim 11 wherein the analog processing circuitry produces a digital output from the unipolar differential analog signal and the polarity signal.

13. A method of processing a bipolar analog differential signal comprising:

producing a polarity signal indicative of a polarity of the bipolar analog differential signal;

converting the bipolar analog differential signal to a unipolar differential analog signal based upon a state of the polarity signal;

processing the unipolar differential analog signal using the polarity signal.

14. The method of claim 13 wherein the processing of the unipolar differential analog signal includes producing a digital output indicative of a magnitude of the unipolar differential analog signal and the state of the polarity signal.

15. A method of periodically processing a differential bipolar analog input signal comprising:

producing a first polarity signal indicative of a polarity of the differential bipolar analog input signal based upon a state of the differential bipolar analog input signal within a first time period;

converting the differential bipolar analog input signal to a first differential unipolar analog signal based upon the state of the differential bipolar analog input signal within the first time period using first polarity signal;

combining the first differential unipolar analog signal with the first polarity signal to produce a first combined output;

producing a second polarity signal indicative of a polarity of the differential bipolar analog input signal based upon a state of the differential bipolar analog input signal within a second time period subsequent to the first time period;

converting the differential bipolar analog input signal to a second differential unipolar analog signal based upon the state of the differential bipolar analog input signal within the second time period using second polarity signal; and combining the second differential unipolar analog signal with the second polarity signal to produce a second combined output.

16. The method of claim 15 wherein the first and second combined outputs are digital outputs indicative of a magnitude and polarity of the differential bipolar analog input signal during the first and second time periods, respectively.

17. An absolute value circuit for use in signal processing applications, said circuit comprising:

analog processing circuitry configured to process unipolar analog signals and having first and second terminals where unipolar differential analog signals appear;

an absolute value circuit having first, second, third and fourth terminals, with the third and fourth terminals of the absolute value circuit being coupled to the first and second terminals, respectively, of the analog processing circuitry and with the absolute value circuit being switchable between a first mode when a polarity signal is in a first state where the first and third terminals are coupled together and the second and fourth terminals are coupled together and a second mode when the polarity signal is in a second state, opposite the first state, where the first and fourth terminals are coupled together and the second and third terminals are coupled together; and a source of the polarity signal indicative of a polarity of a bipolar analog differential signal appearing at the first and second terminals of the absolute value circuit.

18. The absolute value circuit of claim 17 further including a source of the bipolar analog differential signal applied to the first and second terminals of the absolute value circuit and the first and second terminals of the analog processing circuitry comprise input terminals of the analog processing circuitry.

19. The absolute value circuit of claim 18 wherein the source of the polarity signal is configured to sense the polarity of the bipolar analog differential signal applied to the first and second terminals of the absolute value circuit.

20. An absolute value circuit for use in analog/digital signal processing applications, said circuit comprising:

analog processing circuitry configured to process unipolar analog signals and having a first pair of terminals;

an absolute value circuit having a second pair of terminals coupled to the first pair of terminals of the analog processing circuitry and a third pair of terminals, with a first differential analog signal appearing at the second pair of terminals and a second differential analog signal appearing at the third pair of terminals being a same polarity when a polarity signal received by the absolute value circuit is in a first state and with the first differential analog signal and the second differential analog signal being of an opposite polarity when the polarity signal is in a second state opposite the first state; and a source of the polarity signal, with the polarity signal being indicative of a polarity of the first analog differential signal.

21. The circuit of claim 20 wherein further including a bipolar differential analog signal source coupled to the third pair of terminals and wherein the source of the polarity signal being configured to sense a polarity of the bipolar differential analog signal.

* * * * *